United States Patent
Chang et al.

(10) Patent No.: US 8,227,150 B2
(45) Date of Patent: Jul. 24, 2012

(54) HOLOGRAPHIC RETICLE AND PATTERNING METHOD

(75) Inventors: Shih-Ming Chang, Hsinchu (TW);
Chung-Hsing Chang, Hsin-Chu (TW);
Wen-Chuan Wang, Hsin-Chu (TW);
Chi-Lun Lu, Hsin-Chu (TW);
Sheng-Chi Chin, Hsin-Chu (TW);
Chin-Hsiang Lin, Hsin-Chu (TW);
Chun-Kuang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 280 days.

(21) Appl. No.: 12/768,405

(22) Filed: Apr. 27, 2010

(65) Prior Publication Data

US 2010/0297538 A1 Nov. 25, 2010

Related U.S. Application Data

(60) Continuation-in-part of application No. 11/939,790, filed on Nov. 14, 2007, now Pat. No. 7,722,997, which is a division of application No. 10/792,084, filed on Mar. 3, 2004, now Pat. No. 7,312,021.

(60) Provisional application No. 60/534,721, filed on Jan. 7, 2004.

(51) Int. Cl.
*G03F 1/00* (2012.01)
*G03C 5/00* (2006.01)

(52) U.S. Cl. ............................................. 430/5; 430/394
(58) Field of Classification Search .................. 430/1, 2, 430/4, 5, 311, 322, 394; 359/25, 30
See application file for complete search history.

(56) References Cited

U.S. PATENT DOCUMENTS 3,677,634 A 7/1972 Mathisen
(Continued)

FOREIGN PATENT DOCUMENTS

DE 1 331 076 9/1973

OTHER PUBLICATIONS

Wolf, S., Ph.D., et al., "Silicon Processing for the VLSI Era," 2000; pp. 615-635; vol. 1: Process Tech., Second Edition, Lattice Press, Sunset Beach, California, cover page; pp. 615-635.

(Continued)

*Primary Examiner* — Stephen Rosasco
(74) *Attorney, Agent, or Firm* — Slater & Matsil, L.L.P.

(57) ABSTRACT

A hologram reticle and method of patterning a target. A layout pattern for an image to be transferred to a target is converted into a holographic representation of the image. A hologram reticle is manufactured that includes the holographic representation. The hologram reticle is then used to pattern the target. Three-dimensional patterns may be formed in a photoresist layer of the target in a single patterning step. These three-dimensional patterns may be filled to form three-dimensional structures or else used in a multi-surface imaging composition. The holographic representation of the image may also be transferred to a top photoresist layer of a top surface imaging (TSI) semiconductor device, either directly or using the hologram reticle. The top photoresist layer may then be used to pattern an underlying photoresist layer with the image. The lower photoresist layer is used to pattern a material layer of the device.

20 Claims, 15 Drawing Sheets

U.S. PATENT DOCUMENTS

| | | | |
|---|---|---|---|
| 3,712,813 A | | 1/1973 | Ross et al. |
| 4,734,345 A | | 3/1988 | Nomura et al. |
| 4,857,425 A | | 8/1989 | Phillips |
| 4,966,428 A | | 10/1990 | Phillips |
| 5,187,372 A | | 2/1993 | Clube |
| 5,455,850 A | | 10/1995 | Howells et al. |
| 5,504,596 A | | 4/1996 | Goto et al. |
| 5,528,390 A | | 6/1996 | Goto et al. |
| 5,705,298 A | | 1/1998 | Knoedl, Jr. |
| 5,774,240 A | | 6/1998 | Goto et al. |
| 6,107,177 A | * | 8/2000 | Lu et al. .................. 438/597 |
| 6,130,009 A | | 10/2000 | Smith et al. |
| 6,337,173 B2 | | 1/2002 | Jen et al. |
| 6,392,742 B1 | | 5/2002 | Tsuji |
| 6,994,938 B2 | | 2/2006 | Taniguchi |
| 7,081,323 B2 | * | 7/2006 | Eggleton et al. ............ 430/5 |
| 2002/0185634 A1 | * | 12/2002 | Marder et al. ............ 252/582 |

OTHER PUBLICATIONS

Mutzel, M., "Building 3D Nanostructures with Holograms," STP-Gateway; Apr. 3, 2002, http://www.stp-gateway.de/Archiv/archiv475-e.html, 4 pages.

Marder, S.R., et al.; "Materials Absorb Two Photons, Generate Acid on Cue," UniSci Daily University Science News; May 13, 2002, http://unisci.com/stories/20022/0513023.htm, 3 pages.

Stiles, L., "Cornell Researchers Collaborate on a Major Advance in Microfabrication," Cornell Chronicle; May 16, 2002; http://www.news.cornell.edu/Chronicle/02/5.16.02/Ober-3D_fab.html, 2 pages.

* cited by examiner

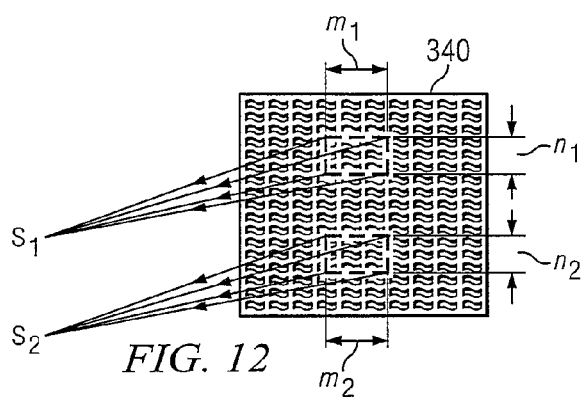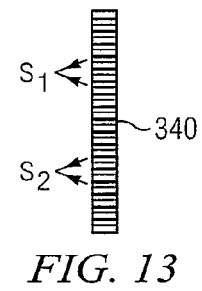
FIG. 12  FIG. 13
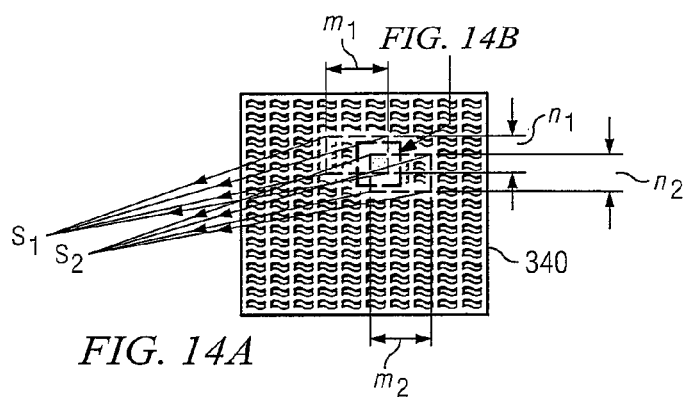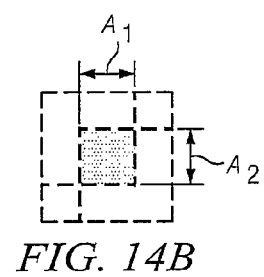
FIG. 14A  FIG. 14B

HOLOGRAPHIC RETICLE AND PATTERNING METHOD

This application is a continuation-in-part of patent application Ser. No. 11/939,790, entitled, "Holographic Reticle and Patterning Method," filed on Nov. 14, 2007, which is a divisional of patent application Ser. No. 10/792,084, entitled "Holographic Reticle and Patterning Method," filed on Mar. 3, 2004, both of which applications are incorporated herein by reference in their entireties for all purposes.

REFERENCE TO COMPUTER PROGRAM LISTING APPENDIX

The material on two identical compact disks, Copy 1 and Copy 2, is incorporated herein by reference. Each compact disc contains computer program listing in a file entitled "TSM02-0658, Appendix A", created on Sep. 18, 2003, having a size of 9 KB.

TECHNICAL FIELD

The present invention relates generally to lithography for semiconductor devices, and more particularly to a reticle design including a holographic pattern and methods of patterning a semiconductor wafer using a holographic reticle.

BACKGROUND

In semiconductor device manufacturing, features and geometric patterns are created on various layers of semiconductor wafers using optical photolithography. Typically, optical photolithography involves projecting or transmitting energy or light through a mask or reticle having a pattern made of optically opaque areas and optically clear areas. Alternatively, a mask or reticle may be reflective rather than transmissive. A phase-shifting mask (PSM) is a type of mask or reticle that uses a phase difference rather than a transmittance difference to generate patterns.

A mask is generally used to pattern an entire wafer at a time, while a reticle is used to pattern a portion of a wafer, e.g., in step-and-repeat projection systems. The term "reticle" as used herein refers to any patterning device having a pattern thereon that may be transferred to the entire surface of a semiconductor wafer, or a portion of a surface of a semiconductor wafer or target.

A prior art reticle 10 used to pattern a target such as a semiconductor wafer is shown in FIG. 1. The reticle 10 may comprise a binary chrome-on-glass mask, for example. A transparent substrate 12 comprising silicon quartz, for example, is provided. An opaque layer 14 is deposited over the substrate 12. The opaque layer 14 typically comprises chrome, for example. The opaque layer 14 is patterned with a desired pattern so that light may pass through transparent regions 16 of the opaque layer 14. The opaque layer 14 of the reticle 10 may be patterned by depositing a photoresist, and patterning the photoresist directly using an electron beam or laser to expose the resist, as examples. The photoresist pattern is then transferred into the opaque layer, e.g., by wet etching.

The reticle 10 may be used to pattern a photoresist layer on a target such as a semiconductor wafer 20, shown in FIGS. 2 and 3. FIG. 2 shows a top view of the wafer 20 and FIG. 3 shows a cross-sectional view of the wafer 20 at 3-3' of FIG. 2. The wafer 20 may comprise a substrate or workpiece 21 having a material layer 23 disposed on the top surface that will be patterned. A photoresist layer 22 is deposited on the top surface of the wafer 20 over the material layer 23 to be patterned. The photoresist layer 22 is patterned by illuminating the photoresist layer 22 of the wafer 20 with energy, e.g., light, through the reticle 10 of FIG. 1. The photoresist layer 22 is then developed, and portions of photoresist layer 22 are removed, leaving a pattern in the photoresist layer 22 that corresponds with the pattern on the reticle 10, shown in FIG. 1. The optically opaque areas 14 of the reticle 10 block the light, thereby casting shadows and creating dark areas, while the optically clear areas 16 allow the light to pass, thereby creating light areas on the wafer 20. The light areas and dark areas may be projected onto and through an optional lens (not shown), and subsequently onto the photoresist layer 22 of the wafer 20.

When the wafer photoresist layer 22 is developed, exposed areas of the photoresist may be removed, leaving a positive image of the reticle 10 in the photoresist layer 22, e.g., for a positive photoresist. Alternatively, unexposed areas of the wafer photoresist layer 22 may be removed, leaving a negative image of the reticle in the photoresist, e.g., for a negative photoresist (not shown).

The patterned photoresist 22 is then used as a mask to pattern the underlying material layer 23 of the wafer 20. For example, the photoresist 22 may be left in place on the wafer 20 while the wafer 20 is exposed to a dry or wet etchant to remove exposed portions of the material layer 23. The photoresist 22 is removed either in a separate etch step, or at the same time the material layer 23 is etched. The patterned material layer 23 is left remaining over the workpiece 21 top surface. Semiconductor wafers 20 are typically manufactured by the deposition and patterning of multiple layers of insulating, conductive and semiconductive materials, in the manner described above. Another way to form the desired layout on the wafers 20 is to process the lithography and developing process, and then deposit a metal or other material layer over the patterned material layer 23, using a damascene process.

The original image of prior art reticles 10 is typically duplicated on the wafer 20, either in the pattern original size, in a 1× magnification scheme, or alternatively, a 4-5× magnification reduction may be used for projection lithography systems to produce a wafer having a material layer 23 pattern that is ¼ or ⅕ smaller than the reticle 10 pattern, for example. Thus, a one-to-one corresponding relationship exists in prior art reticle 10 patterns and images produced on the wafer 20.

A disadvantage of prior art lithography is that this one-to-one relationship between the reticle 10 and the wafer 20 can result in a reticle defect 18, particularly if the defect is large, inducing a flaw 23a on a wafer 20. Hard defects and/or soft defects can be formed during the manufacturing process or handling of a reticle 10. Soft defects refer to pattern defects that may be removed by cleaning, whereas hard defects generally refer to pattern defects that cannot be removed by a cleaning process. Reticles 10 having relatively large reticle defects 18 are unacceptable because the defect may be transferred to the target 20.

Because reticles 10 are typically expensive and time-consuming to manufacture, attempts are usually made to repair them, rather than scrapping them. Larger hard opaque defects 18 are often removed using a laser to evaporate unwanted material. However, reticle 10 defect inspection and repair are difficult, time-consuming tasks. Also, laser repair of a reticle 10 can damage the reticle substrate, leaving a laser burn and possibly creating a printable defect on the substrate 21. The repair of some reticle 10 defects is often impossible to achieve.

SUMMARY OF THE INVENTION

These and other problems are generally solved or circumvented, and technical advantages are generally achieved, by preferred embodiments of the present invention, in which a layout pattern or image to be transferred to a target is converted into a holographic representation of the image, and a hologram reticle is manufactured that includes the holographic representation. The hologram reticle is then used to pattern a wafer. Advantageously, imperfections or defects on the hologram reticle are not transferred to the wafer. The original image is partitioned and encoded across the entire hologram reticle, which breaks the one-to-one corresponding relationship between defects on the reticle to the wafer. A defect on the hologram reticle does not directly induce a flaw on a wafer, but rather, the defect influence is spread into the entire hologram reticle image, and merely affects the intensity or contrast of the hologram reticle slightly.

In accordance with a preferred embodiment of the present invention, a lithography reticle includes a material having a pattern, the pattern including opaque regions and transparent regions, the pattern comprising a holographic representation of an image, wherein the holographic representation of the image is formed using a Computer-Generated Holography encoding technique.

In accordance with another preferred embodiment of the present invention, a method of manufacturing a lithography reticle includes providing an image, creating a holographic representation of the image using a local encoding technique (LET), providing a material, and patterning the material with the holographic representation of the image, wherein the patterned material comprises transparent regions and opaque regions.

In yet another preferred embodiment of the invention, a method of patterning a target includes providing a target, the target having a top surface, the target top surface having a material layer disposed thereon, a first photoresist layer disposed over the material layer, a transparent spacer material disposed over the first photoresist layer, and a second photoresist layer disposed over the spacer material. The method includes patterning the second photoresist layer of the target with a holographic fringe representation of an image.

Another embodiment of the invention is a method of patterning a target. The method includes providing a target, the target having a top surface, the target top surface having a photoresist layer disposed thereon, and providing a lithography reticle, the lithography reticle comprising a holographic representation of an image to be patterned on the target. The photoresist layer is patterned with a three-dimensional pattern using the lithography reticle, and depositing a material layer over the photoresist layer. The photoresist layer is removed, leaving three-dimensional structures comprised of the material layer disposed over the target.

Another embodiment is a method of patterning a material comprising providing a substrate comprising a material layer. A photosensitive material is applied over the material layer and a first image is formed within the photosensitive material, the first image being at a first depth from a top surface of the photosensitive material. A second image is formed within the photosensitive material, the second image being at a second depth different from the first depth. The first image is developed to form a developed first image and photosensitive material located at the first depth is removed without removing the developed first image. The second image is developed to form a developed second image and photosensitive material located at the second depth is removed without removing the developed second image. The developed first image and developed second image are used as a mask to pattern the material layer.

Another embodiment is a method of forming a mask comprising providing a substrate and applying a photosensitive material over the substrate. An image is formed within the photosensitive material, the image comprising a first element at a first depth from a top surface of the photosensitive material and a second element at a second depth different from the first depth. The first element is developed to form a first developed element and a first portion of undeveloped photosensitive material is removed to expose the second element. The second element is developed to form a second developed element and a second portion of undeveloped photosensitive material is removed to expose the substrate.

Another embodiment is a method of pattern comprising providing a substrate and applying a photosensitive material to the substrate. The substrate is placed into an imaging device, the imaging device comprising a reticle. A multi-surface imaging composition is formed in the photosensitive material by exposing the photosensitive material to an energy that is filtered by the reticle. The multi-surface imaging compositing comprises a first image at a first depth within the photosensitive material and a second image at a second depth different from the first depth within the photosensitive material, the second image being laterally removed from the first image. A first silyation is performed on the first image while the second image remains protected from the first silyation. A first portion of photosensitive material is removed to expose the second image. A second silyation is performed on the second image and a second portion of photosensitive material is removed to expose the sidewalls of the second image after the performing a second silyation.

An advantage of preferred embodiments of the present invention includes providing a defect-withstanding reticle for patterning a target. Defects on the hologram reticle do not result in the formation of defects on the patterned target surface. Thus, there is a reduced need for repair of defects on the reticle, resulting in a cost savings. The depth of focus (DOF) may be increased to extend the lithography process window, particularly on a topographic substrate. A further advantage of preferred embodiments of the present invention is the ability to precisely control and decrease the DOF, and form three-dimensional (3-D) structures in the photoresist layer on the target.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 12 illustrates a top view of a hologram reticle in accordance with an embodiment of the invention;

FIG. 13 shows a cross-sectional view of the hologram reticle shown in FIG. 12;

FIG. 14A illustrates a top view of a hologram reticle in accordance with an embodiment of the invention;

FIG. 14B shows a more detailed view of a portion of the reticle shown in FIG. 14A;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, to a lithography reticle and method for patterning semiconductor wafers. Embodiments of the invention may also be applied, however, to other fields of lithography and lithography for other types of targets.

Figure 4:
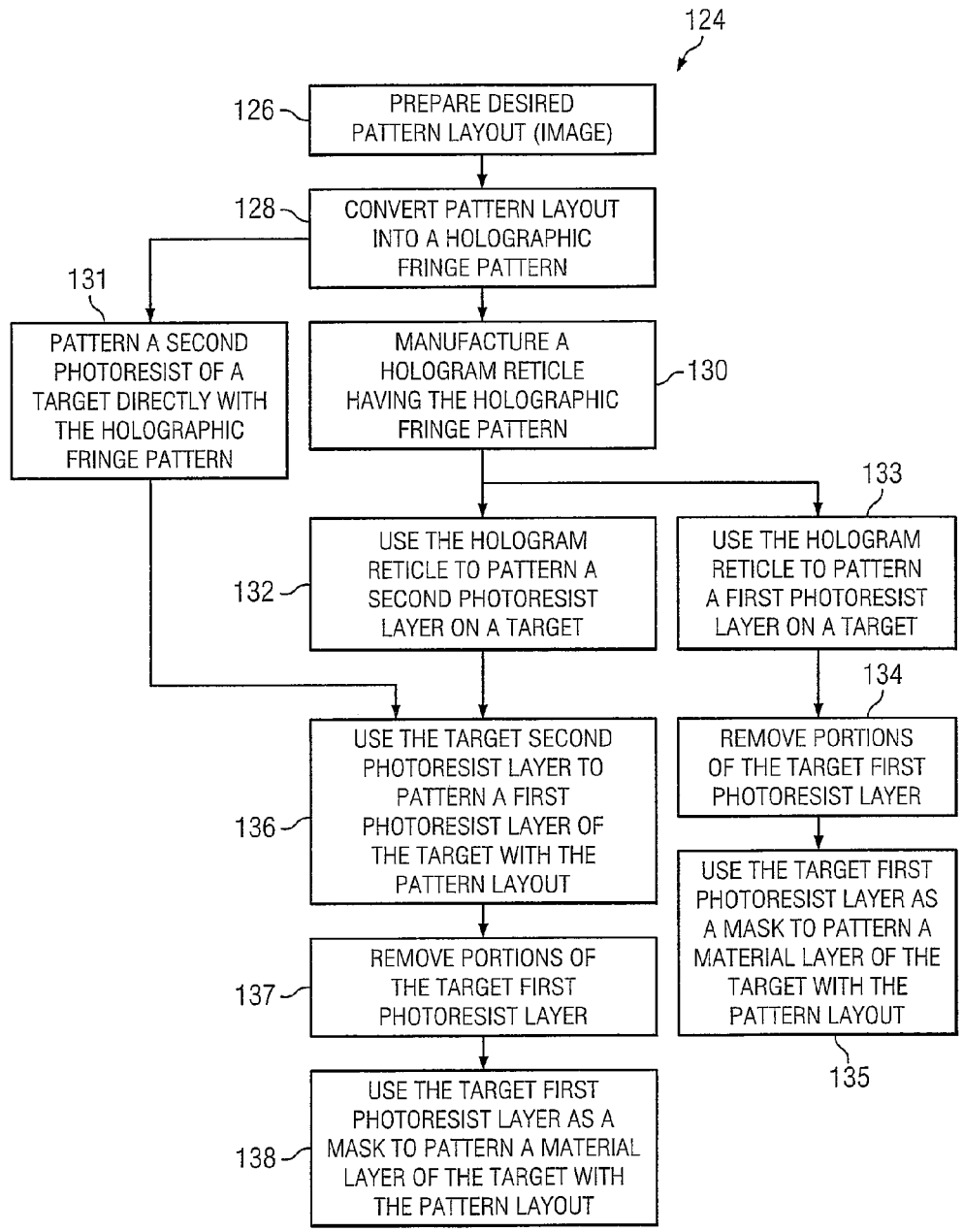
FIG. 4 is a flow chart showing a method of manufacturing and using a hologram reticle in accordance with embodiments of the present invention.

FIG. 4 is a flow chart 124 illustrating methods of manufacturing and using a hologram reticle in accordance with embodiments of the present invention. First, the desired pattern layout is prepared (step 126). The desired pattern layout, also referred to herein as an image, preferably comprises a pattern that will be transferred to a material layer of a target or wafer 120/220/420 (see FIGS. 15, 18 and 23, respectively). The pattern layout is converted into a holographic fringe pattern (step 128), preferably using an encoding technique such as computer generated holography (CGH), as an example. The encoding hologram imaging technique may utilize software adapted to implement a local encoding technique (LET) in one embodiment. Alternatively, the encoding hologram imaging technique may comprise a fast Fourier transform (FFT) method of generating a holographic fringe pattern, as examples. A preferred embodiment of the programming code in C for the encoding of the pattern layout into a holographic fringe pattern is disclosed in Appendix A, which may be found in the file "TSM02-0658, Appendix A" of the computer programming listing appendix provided on compact disc submitted with this patent application, which is incorporated by reference. However, the C code disclosed herein is exemplary, and the embodiments described herein may be implemented in other types of code and form.

Referring again to the flow chart 124 of FIG. 4, next, in some embodiments of the invention, a hologram reticle 140/240/340/440 is manufactured having the holographic fringe pattern patterned into an opaque layer (step 130). The hologram reticle 140/240/340/440 is then used to pattern a first photoresist layer 122 on a target (step 133) (see FIGS. 15-16). Portions of the target first photoresist layer are then removed (step 134), and then the target first photoresist layer 122 is used as a reticle to pattern a material layer of the target (step 135).

Figure 17:
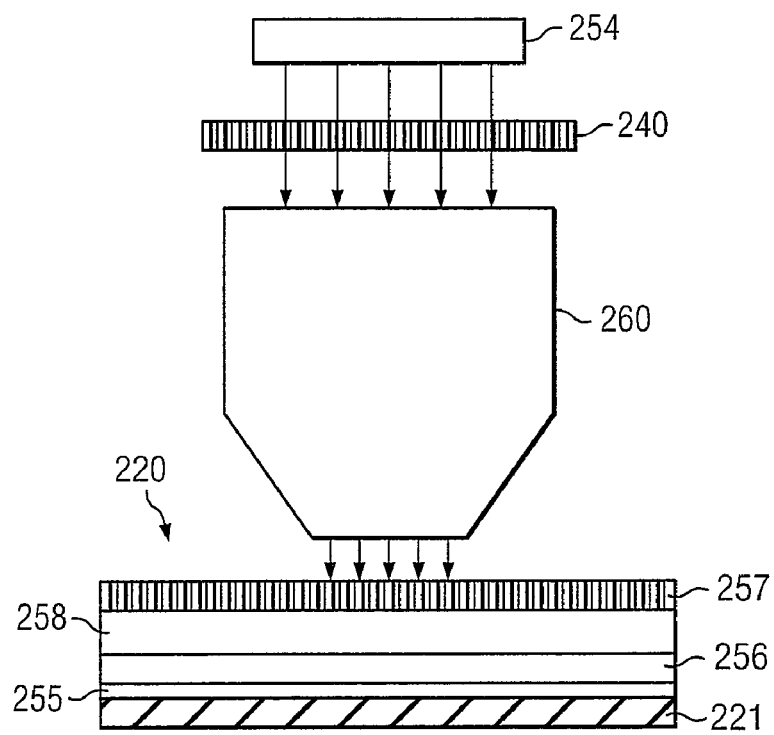
FIG. 17 shows a reconstruction scheme in accordance with an embodiment of the invention, wherein a holographic representation of an image is duplicated on a top layer of photoresist on a target.
Figure 18:
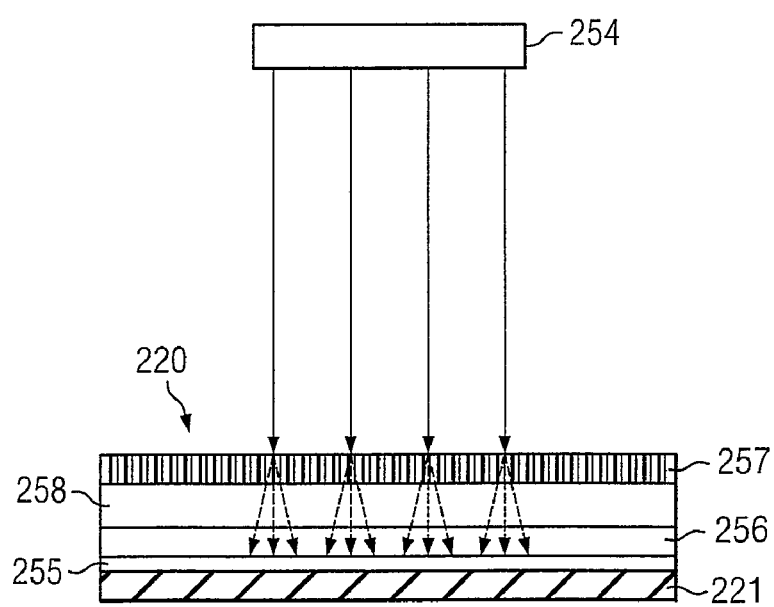
FIG. 18 illustrates the target of FIG. 17, wherein the top layer of photoresist having the holographic representation of an image is illuminated to reconstruct the image on a bottom layer of photoresist disposed below the top layer of photoresist on the target.

In another embodiment, the target comprises a first photoresist layer and a second photoresist layer formed over the first photoresist layer, as shown in FIGS. 17 and 18. The hologram reticle having a holographic fringe pattern is used to pattern the second photoresist layer (step 132). The second photoresist layer of the target is then used to pattern the first photoresist layer of the target (step 136) with the image, and portions of the first photoresist layer of the target are removed (step 137). The first photoresist layer is then used as a reticle to pattern the image onto a material layer of the target (step 138).

In yet another embodiment, no hologram reticle is required, and the target comprises a first photoresist layer and a second photoresist layer formed over the first photoresist layer. The second photoresist layer of the target is patterned directly with the holographic fringe pattern (step 131). The target second photoresist layer is then used to pattern the first photoresist layer of the target (step 136), and portions of the first photoresist layer are removed (step 137). The first photoresist layer is then used as a reticle to pattern a material layer of the target (step 138).

Details of the preferred embodiments illustrated in the flow chart 124 will be described further herein. Embodiments of the present invention may be used to pattern periodic (e.g., repeating) patterns, or general patterns having no particular repetition. After the hologram reticle is manufactured, it may be stored, e.g., on a shelf, until it is time to manufacture wafers with the image that is patterned in holographic form onto the hologram reticle. The hologram reticle may be used and stored in the same manner as traditional masks and reticles of the past. Advantageously, embodiments of the hologram reticles described herein are compatible with existing exposure tools and lithography systems currently in use. The holograph reticles and methods of patterning using holographic techniques described herein may be used to pattern a plurality of different types of material layers on a target, such as conductors, insulators and semiconductors, as examples.

Figure 1:
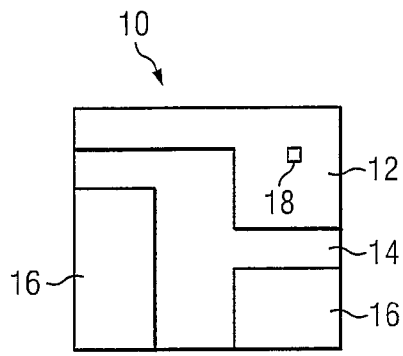
FIG. 1 shows a top view of a prior art reticle having a defect thereon.
Figure 2:
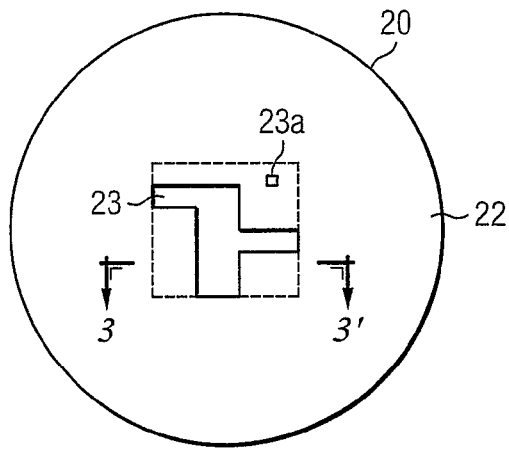
FIG. 2 shows a top view of a prior art wafer upon which the reticle defect has been transferred.
Figure 3:
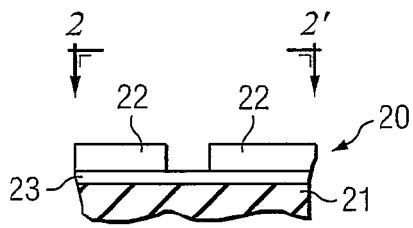
FIG. 3 shows a cross-sectional view of the wafer shown in FIG. 2.
Figure 5:
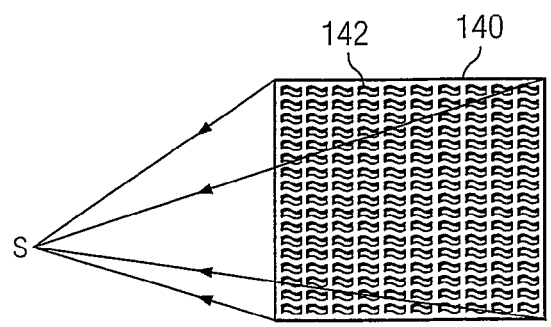
FIG. 5 shows a top view of a hologram reticle having a holographic fringe pattern in accordance with an embodiment of the present invention.
Figure 20:
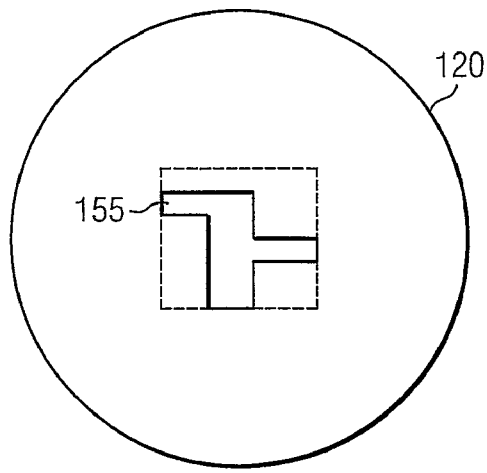
FIG. 20 shows a semiconductor wafer having a material layer that has been patterned using the hologram reticle of FIG. 19, wherein the hologram reticle defects are not transferred to the wafer pattern.

FIG. 5 shows a top view of a hologram reticle 140 having a holographic fringe pattern 142 formed in an opaque layer 146 (see FIG. 6), in accordance with an embodiment of the present invention. The original pattern layout to be patterned on the target (such as the pattern of opaque layer 14 shown in the prior art drawing of FIG. 1) and the encoded holographic fringe pattern 142, shown in FIG. 5, are quite different, in accordance with embodiments of the invention. The holographic fringe pattern 142 is preferably computer generated, and may appear visually to the eye of a viewer as a plurality of random dots or apertures, as shown. The image to be patterned on the target is generally not visibly recognizable in the pattern 142 formed on the hologram reticle. However, the holographic fringe pattern correlates to the desired pattern layout or image that will be transferred to the target 120 (see FIG. 20). The original image will appear after the reconstruction process on the target 120.

Figure 6:
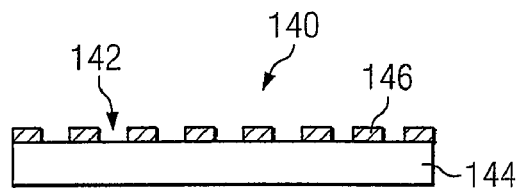
FIG. 6 illustrates a cross-sectional view of the hologram reticle shown in FIG. 5, including a substrate and an opaque material patterned with a holographic representation of an image to be transferred to a target disposed over the substrate.

FIG. 6 illustrates a cross-sectional view of the hologram reticle 140 shown in FIG. 5. The hologram reticle 140 includes a substrate 144 and an opaque material 146 disposed over the substrate 144. The substrate 144 preferably comprises a transparent material, such as quartz, and alternatively may comprise other transparent materials, for example. The substrate 144 preferably comprises a thickness of about 1 mm, for a commercially available diffraction optical element, to about one-quarter inch for a conventional 6 inches quartz mask, as examples. Alternatively, the substrate 144 may comprise other thicknesses.

The opaque material 146 preferably comprises a metal such as chrome, and may alternatively comprise other metals and opaque materials, for example. The opaque material 146 is preferably about 700 nm to 1000 nm thick, for example, although the opaque material 146 may alternatively comprise other thicknesses. The opaque material 146 is preferably patterned by depositing a photoresist over the opaque material 146, patterning the photoresist using an electron beam or laser, as examples, (although other patterning methods may be used) removing exposed (or unexposed) portions of the photoresist, and then using the photoresist as a mask to remove portions of the opaque material 146. Alternatively, rather than using a photoresist, the opaque material 146 may be directly patterned by a reactive ion etch (RIE) process or by ion milling, as examples. The hologram reticle 140 preferably comprises a transmissive, thin-film, binary hologram reticle, as shown in FIG. 6.

Figure 7:
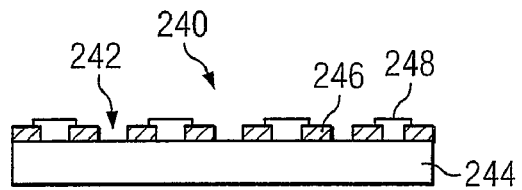
FIG. 7 illustrates an alternative embodiment of a hologram reticle including a phase-shifting material formed over portions of the holographic fringe pattern.

In another embodiment, shown in FIG. 7, the hologram reticle 240 may comprise phase shifting regions 248 disposed proximate the substrate 244 between portions of the opaque regions 246, in particular, disposed or formed over portions of the holographic fringe pattern 242. The phase shifting regions 248 may comprise an additional layer of transparent material, as shown, or alternatively, portions of the substrate 244 may be removed to reduce the thickness of the substrate 244 and create phase-shifting regions, for example (not shown). The hologram reticle may be implemented in any other reticle configuration, such as a reflective volume, thin-film, binary, phase, or imprint with physical contact reticle, as examples.

Figure 8:
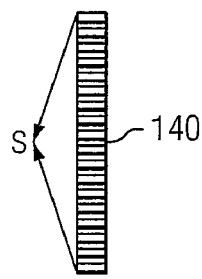
FIG. 8 shows a side view of the hologram reticle shown in FIG. 5.

FIG. 8 shows a cross sectional view of the hologram reticle 140 shown in FIG. 5. In one embodiment of the present invention, a Computer-Generated Holography encoding technique, such as an FFT encoding technique, is used to encode the entire image, the entire image being represented by the letter "S" in FIGS. 5 and 8, into a pattern for a hologram reticle. FFT is a technology used in the fields of mathematics, physics, and digital imaging processes, for example. With FFT, for each image S shown in FIGS. 5 and 8, holographic fringe must be calculated across the entire hologram.

Figure 9:
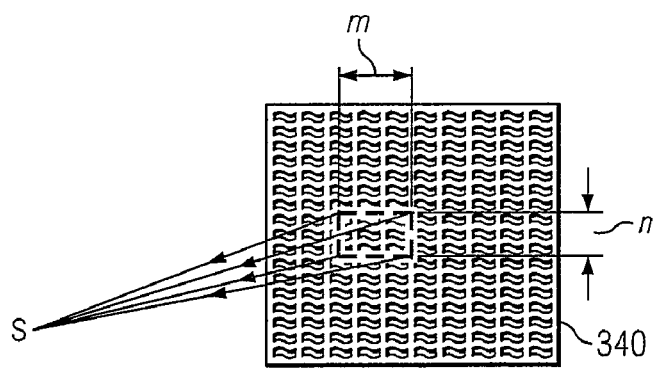
FIG. 9 illustrates a top view of a hologram reticle in accordance with an embodiment of the invention.
Figure 10:
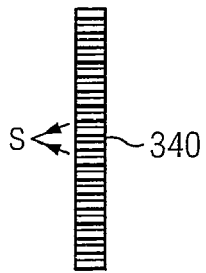
FIG. 10 shows a cross-sectional view of the hologram reticle shown in FIG. 9.

In accordance with another embodiment of the present invention, an LET encoding technique is used to encode only a portion of the image into a pattern for a hologram reticle. The portion of the image encoded to the hologram reticle is represented by the letter "S" in FIGS. 9 and 10, which illustrate a top view and a cross-sectional view, respectively, of a hologram reticle 340 in accordance with an embodiment of the invention. The portion of the image S of FIGS. 9 and 10 has a width m and a height n. Thus, in the LET encoding technique, the image is encoded into an m×n area on the hologram reticle 340. A plurality of image portions S are encoded using LET in accordance with an embodiment of the present invention, until the entire surface of the image is encoded into a holographic representation.

By using an LET, for each image portion S, only the area A which is defined by m×n needs to be calculated. This is advantageous in that the calculation time is greatly reduced. For example, a six inch reticle may have a total area of about 132,000 μm by 132,000 μm, and an LET area A may be, for example, about 100 μm×100 μm. That is, approximately over 0.5 million points of data may need to be calculated. The use of LET in accordance with embodiments of the present invention advantageously reduces the time required for the calculation process to encode the image into a holographic pattern, and reduces the use of computer resources required for the calculation process. Using an LET not only saves time but also makes the intensity, phase, and DOF of individual points in the patterning process more controllable.

Figure 11A:
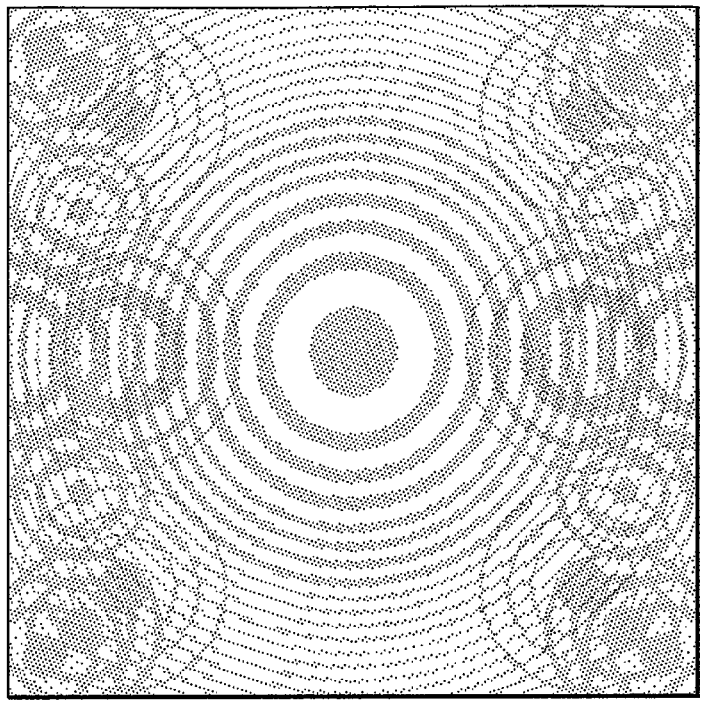
FIGS. 11A and 11B illustrate visual illustrations of light sources that may be used in a look-up table having a plurality of templates of holographic fringes in accordance with an embodiment of the present invention.
Figure 11B:
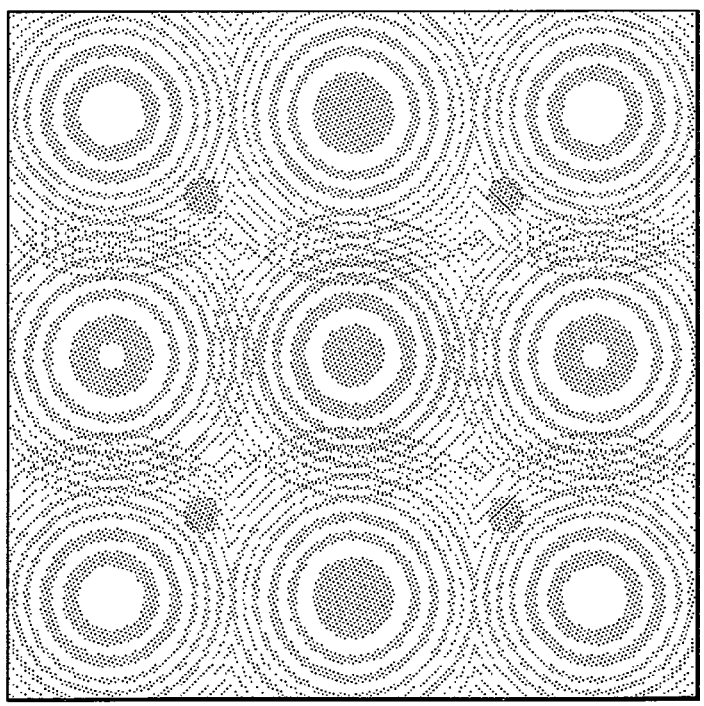

A "look-up table" concept may be used to further reduce the time required for the large number of calculations required. The look-up table may comprise a plurality of visual illustrations of light sources that may be selected. For example, the visual illustrations of light sources may comprise a fringe pattern from a 1×1 matrix single point light source such as the one shown in FIG. 11A, or a fringe pattern from a 3×3 matrix three point light source such as the one shown in FIG. 11B. Alternatively, the visual illustrations of light sources may comprise other numbers and arrangements of light source matrixes, such as 1×2, 1×3, 1×4, . . . 2×1, 2×2, 2×3, 2×4 . . . 4×4, 4×1, 4×2, 4×3, 4×4, 4×5, etc., as examples, not shown. The look-up table may include a plurality of templates of fringe patterns such as the ones shown in FIGS. 11A and 11B, for example. The number of fringe patterns in the look-up table depends on the complexity of the layout, for example. The intensity of the individual image portion S of FIGS. 9 and 10 may be controlled by adjusting the size of the area A. The reconstruction characteristics of the image portion S can also be controlled by modifying the dimensions m and n.

The encoding of portions of the image is repeated until the entire reticle is encoded, as shown in FIGS. 12 and 13. Each portion encoded S1 has an associated area m1×n1, and associated area m2×n2, for portion S2, for example. Note that if the area of m2×n2 is larger than the area of m1×n1, then the intensity of S2 will be higher than the intensity of S1. However, the intensity of S1 and S2 can be controlled individually by controlling the size of the encoding area.

S1 and S2 denote two individual patterns or image portions, and can be considered as two points of light sources. The arrows represent the light paths coming from the hologram reticle 340 and focusing to the target (to form image portion S) during the reconstruction process. The area m by n denotes how large the area or how many pixels contribute to reconstruct the image portion S during the imaging or reconstruction process. The unit of m and n may comprise length (for example, several μm or nm) or simply pixels, and may alternatively comprise a minimum component size on the reticle 340. The size or dimension of m and n may be approximately between several to hundreds of μm in one embodiment.

The individual intensity will be decreased if there is overlapping of the encoded area. An illustration of this phenomena is shown in a top view of a hologram reticle 340 in FIG. 14A. The intensity decreasing coefficient (IDC) may be expressed by Equation 1:

$$\frac{1}{2} \times \frac{1}{mn} \times \{[A_1 \otimes A_2]\}; \qquad \text{Eq. 1}$$

where $A_1 \otimes A_2$ represents the area of overlapping, with $A_1$ being the amount of horizontal overlap and $A_2$ being the amount of vertical overlap, wherein m1=m2=m and n1=n2=n. FIG. 14B shows a more detailed view of the area of overlap.

Equation 1 expresses the IDC for two overlapping image portions S1 and S2. Similarly, the IDC for three overlapping image portions may be represented by Equation 2:

$$\frac{1}{2} \times \frac{1}{mn} \times \{[A_1 \otimes A_2] + [A_1 \otimes A_3]\} - \frac{1}{3} \times \frac{1}{mn} \times \{[A_1 \otimes A_2 \otimes A_3]\} \qquad \text{Eq. 2}$$

and the IDC for four overlapping image portions may be represented by Equation 3:

$$\frac{1}{2} \times \frac{1}{mn} \times \{[A_1 \otimes A_2] + [A_1 \otimes A_3] + [A_1 \otimes A_4]\} - \\ \frac{1}{3} \times \frac{1}{mn} \times \{[A_1 \otimes A_2 \otimes A_3] + [A_1 \otimes A_2 \otimes A_4] + [A_1 \otimes A_3 \otimes A_4]\} + \\ \frac{1}{4} \times \frac{1}{mn} \{[A_1 \otimes A_2 \otimes A_3 \otimes A_4]\} \qquad \text{Eq. 3}$$

If two reconstruction image portions S1 and S2 are located too close together, their A1 and A2 will overlap on the hologram reticle, as shown in FIG. 14B. The size of A will affect the intensity of S; therefore, when there is overlap, the intensity of image portions S1 and S2 are both decreased because by sharing the overlapping area [A1⊗A2] with each other, the "effective" areas of A1 and A2 are decreased. In this case, the IDC quantifies the effect of the decrease area. The IDC depends on the location and distance of the overlapping. According to the IDC, the loss of intensity can be compensated by increasing the size of the area A.

Figure 15:
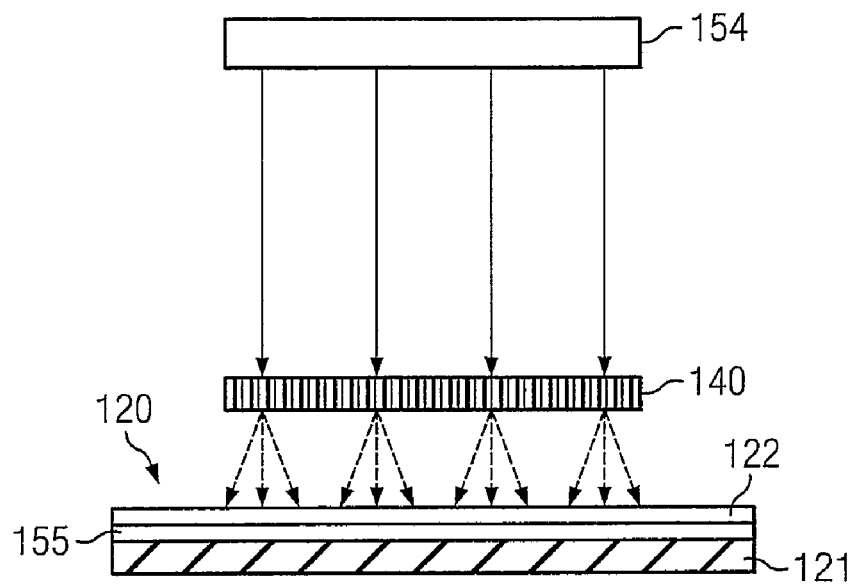
FIG. 15 shows an embodiment of the invention, wherein a hologram reticle is directly illuminated to transfer or reconstruct the image to a photoresist layer of a target.

FIG. 15 illustrates an embodiment of the invention, wherein a hologram reticle 140 is directly illuminated with illumination or a beam from energy source 154 to transfer or reconstruct the image to a target 120. The target 120, shown in cross-sectional view, may comprise a semiconductor wafer, as an example, including a workpiece 121, a material layer 155 disposed over the workpiece, and a layer of photoresist 122 disposed over the material layer 155. The workpiece 121 may include a semiconductor substrate comprising silicon or other semiconductor materials covered by an insulating layer, for example. The workpiece 121 may also include other active components or circuits, not shown. The workpiece 121 may comprise silicon oxide over single-crystal silicon, for example. The workpiece 121 may include other conductive layers or other semiconductor elements, e.g. transistors, diodes, etc. Compound semiconductors, GaAs, InP, Si/Ge, or SiC, as examples, may be used in place of silicon. The material layer 155 may comprise a conductive material, insulative material, semiconductive material, or other materials, as examples. The photoresist 122 comprises an organic or polymer resist typically used in lithographic techniques.

In this reconstruction method, the target or wafer 120 is directly illuminated, with a hologram reticle 140 (or 240 or 340) described herein being disposed between the source of illumination (e.g., energy source 154) and the target 120. The energy source 154 may comprise a coherent or partial coherent light source such as a laser source, as examples, although other energy sources may alternatively be used. In this embodiment of the invention, energy is directed substantially perpendicular to the surface of the target 120. The energy may comprise a beam, such as an electron beam or an ion beam, as examples. The holographic fringe pattern of the hologram reticle 140 is adapted to expose the photoresist 122 and form the desired image on the photoresist 122 of the target 120. The photoresist 122 is then developed, and portions of the photoresist 122 are removed. The photoresist is then used as a mask to etch the material layer 155 of the target 120 and form the image within the material layer 155.

The reconstruction processes for the hologram imaging technique described herein preferably comprise a combination of constructive and destructive interference. The incident angle of illumination also affects the hologram imaging technique reconstruction.

Figure 16:
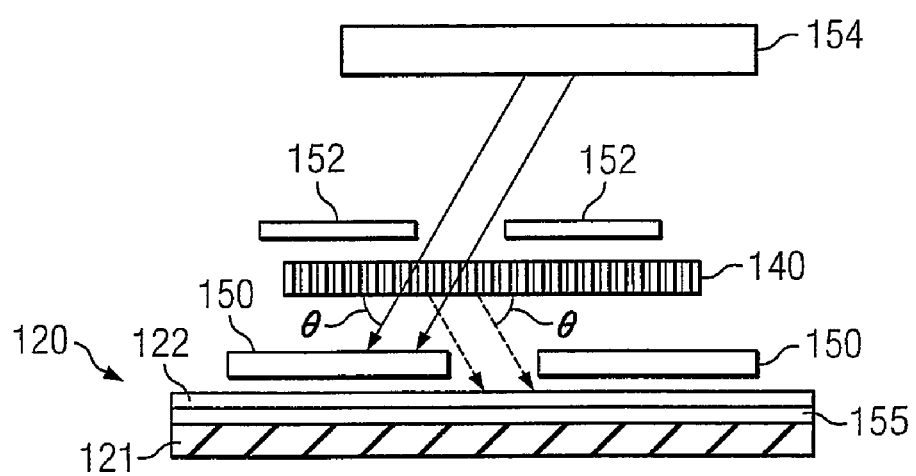
FIG. 16 shows another embodiment of the present invention, wherein a hologram reticle is illuminated with an oblique beam to transfer the image to a photoresist layer of a target.

In another embodiment, shown in FIG. 16, a hologram reticle 140 is illuminated with an oblique beam (e.g., a beam that is directed non-perpendicular to the surface of the workpiece 121) to transfer the image to the target 120. The oblique beam is used to illuminate the target 120 through the hologram reticle 140. In this embodiment, a wafer blade 150 may be disposed between the target 120 and the hologram reticle 140, and/or a reticle blade 152 may be disposed between the energy source 154 and hologram reticle 140. The wafer blade 150 and/or reticle blade 152 may be moved while the target 120 is illuminated, in the same or opposing directions, for example. The incident illumination light or oblique beam is directed at an angle to project a shadow on the wafer blade 150. The reticle blade 152 controls the size of the slit, to optimize the performance of the hologram reticle 140 lithography system. The reticle blade 152 is adapted to block the unwanted incident illumination. Similarly, the wafer blade 150 is adapted to block unwanted diffraction lights, such as high order diffraction beams, as an example. The angle θ may comprise 30 degrees, as an example, and more preferably, angle θ ranges from 15 to 45 degrees, for example.

Embodiments of the invention may also be implemented on a target having multiple layers of photoresist, also referred to herein as top surface imaging (TSI), as shown in FIGS. 17 and 18. TSI involves patterning features on a target using two photoresist layers 257 and 256 deposited over the target 220, with a spacer 258 separating the two photoresist layers 257 and 256. The top photoresist layer 257 preferably comprises a thickness of about 500 Å, and the bottom photoresist layer 256 preferably comprises a thickness of about 3000 Å, as examples, although the top and bottom photoresist layer 257 and 256 may alternatively comprise other thicknesses. The top photoresist 257 is used to pattern the underlying photoresist layer 256. The spacer 258 or buffer layer preferably comprises a transparent material that is adapted to separate the top photoresist 257 from the bottom photoresist layer 256 (often referred to as a "button" layer) by a predetermined distance; e.g., the spacer may comprise a thickness between about 3,000 to 10,000 Å, as examples. The spacer 258 may comprise spin-on glass (SOG) or borophosphosilicate glass (BPSG), as examples, although alternatively, other optically transparent materials may be used. In this embodiment, the top photoresist 257 functions as a secondary hologram reticle, implemented in TSI on the target 220. The secondary hologram reticle 257 is also defect-withstanding and CD-error insensitive, as is the hologram reticle 240, to be described further herein.

FIG. 17 shows a reconstruction scheme in accordance with an embodiment of the invention, wherein the holographic representation of the hologram reticle is duplicated on the top layer of photoresist 257 on a target 220. Using an exposure tool 260, energy from an energy source 254 is passed through a hologram reticle 240 to pattern the top photoresist layer 257 with the holographic representation of an image. The exposure tool 260 may comprise, as examples, an optical exposure tool such as a stepper, scanner or imprint tool, although other exposure tools may alternatively be used. The target top photoresist layer 257 is then developed, preferably using a gas or dry development, as examples, without destroying the bottom layer of photoresist 256. Preferably, during the exposure step and subsequent development step of the top photoresist layer 257, the remaining layers of the target 220, such as workpiece 221, material layer to be patterned 255, photoresist layer 256, and spacer 258, remain substantially unaffected.

In one embodiment, the TSI latent pattern having the holographic fringe representation of the desired image to be patterned may be formed in the top photoresist layer 257 by a lithography process with a hologram reticle as shown in FIG. 17, or alternatively, the TSI latent pattern be formed by direct-writing a holographic representation of the desired image onto the top photoresist layer 257 (not shown). Alternatively, the holographic representation of the desired image may be formed into the top photoresist layer 257 by another maskless lithography process such as by RIE or by ion milling, as examples (also not shown).

FIG. 18 illustrates the target 220 of FIG. 17, wherein a reconstructed image is formed on the bottom photoresist layer 256 that is substantially the same as the original image. The patterned top layer of photoresist 257 is illuminated with a beam of energy from the energy source 254 to reconstruct the desired image on the bottom layer of photoresist 256. The photoresist 257 that is patterned with a holographic representation of the desired image is removed, and the spacer 258 is removed. The bottom layer of photoresist 256 is developed, and then the bottom photoresist layer 256 is used as a mask to pattern the material layer 255 of the target 220. The material layer 255 then comprises the desired image. The bottom photoresist layer 256 is then removed, and subsequent processing steps may then be performed on the target 220 to complete the manufacturing process.

Figure 19:
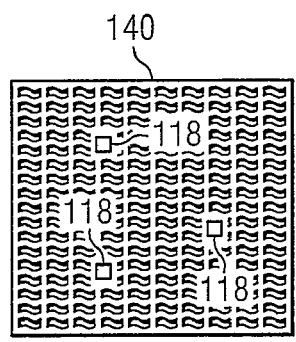
FIG. 19 shows a hologram reticle in accordance with embodiments of the present invention having defects thereon.

FIG. 19 shows a top view of a hologram reticle 140 in accordance with embodiments of the invention having defects 118 disposed thereon. Due to the nature of a holographic pattern, any defects 118 on the hologram reticle 140 will not be transferred to a target such as the semiconductor wafer 120 shown in FIG. 20 when the hologram reticle 140 is used to pattern the wafer 120. The holographic representation of the image breaks the one-to-one relationship between the reticle pattern and the image in the material layer 155 patterned. Advantageously, any defects 118 on the hologram reticle 140 merely affect the intensity of the holographic image, and are not transferred to the desired image that is patterned within the material layer 155 of the wafer 120.

Figure 21:
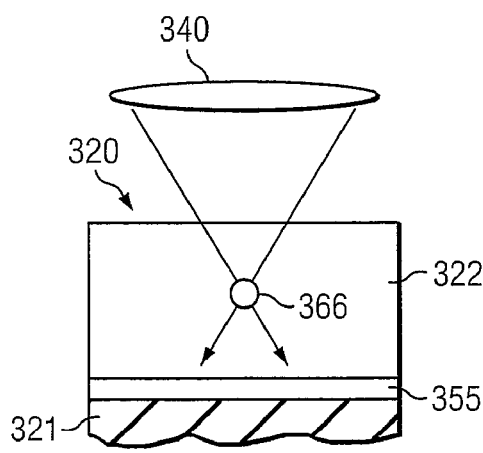
FIG. 21 illustrates a cross-sectional view of photoresist formed over a workpiece, illustrating that the depth of focus may be varied to pattern at a predetermined vertical depth within the photoresist in accordance with an embodiment of the present invention.

FIG. 21 illustrates a cross-sectional view of photoresist 322, showing how the depth of focus (DOF) may be varied to pattern at a particular vertical depth within the photoresist 322 perpendicular to the target 320 surface, in accordance with an embodiment of the present invention. The target or wafer 320 comprises a workpiece 321 and a material layer 355 to be patterned. A layer of photoresist 322 has been formed over the material layer 355. The depth of focus, using the hologram reticle 340, may be varied to pattern at any depth within the photoresist 322, as shown.

In one embodiment of the present invention, a two-photon process is used to pattern a photoresist layer. A two-photon process is a non-linear quantum photochemical reaction. With suitable situation and material, a molecule can absorb two low energy photons (for example, having a wavelength of about 800 nm) rather than one high energy photon (having a wavelength of about 400 nm). This non-linear phenomenon happens only in an area with a very high density of photons. In accordance with embodiments of the present invention, a very high density area is created by virtual light sources of the holographic reconstruction images. More specifically, a 3-D structure pattern may be created or reconstructed in a photoresist layer using a holographic reticle with a laser beam.

Figure 22:
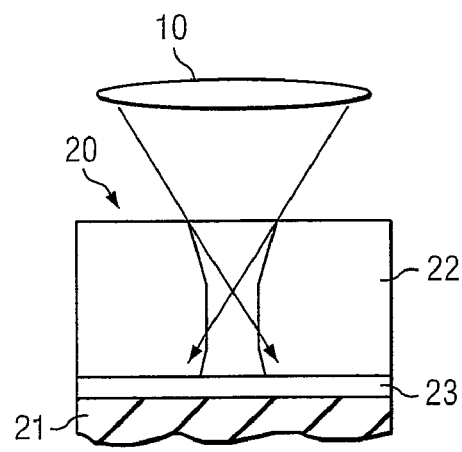
FIG. 22 shows a prior art cross-sectional view of photoresist patterned completely in the vertical direction.

With sufficient illumination intensity, the resist 322 will be exposed by absorbing two low energy photons such as infrared (IR) photons rather than one high energy photon such as the ultraviolet (UV) photon. This two-photon process occurs close to the focal point 366 with high photon density. In this manner, one spot (e.g., focal point 366) may be exposed at a time using a two-photon process. In contrast, prior art photolithography techniques involve using an traditional imaging system with a conventional mask 10 to pattern resist 22 on a target 20 completely in the vertical direction, as shown in FIG. 22. The condensed energy beam induces the vertical cylinder shape of resist 22 that is exposed, in prior art photolithography techniques.

Figure 23:
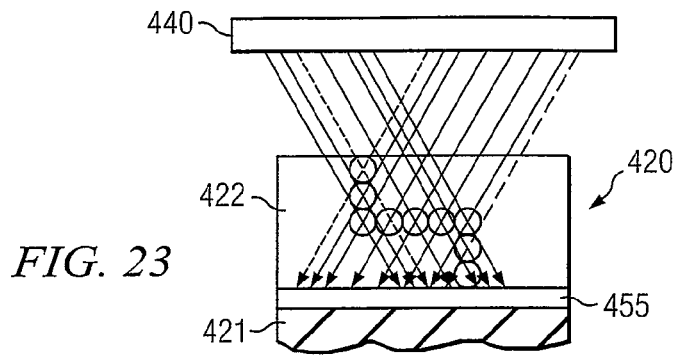
FIG. 23 shows an embodiment of the invention, wherein the depth of focus is varied at a plurality of locations, to create a 3-D pattern in the photoresist layer.

In accordance with an embodiment of the present invention, a target 420 comprises a workpiece 421 and a material layer 455 deposited over the workpiece 421, as shown in FIG. 23. A photoresist layer 422 is deposited over the material layer 455. The photoresist 422 may be patterned at two or more depths, or a range of depths, as shown in FIG. 23, to create a 3-D pattern, e.g., using a two-photon illumination process. A direct write scheme may be used to construct 3-D structures in the photoresist layer 422, for example. By using the holographic imaging processes described herein, a plurality of locations within the layer of photoresist 422 may be exposed in a single exposure.

For example, generally, a semiconductor manufacturing process contains a front-end and back-end, referring to periods of time in the manufacturing flow. The frond-end is the portion of the manufacturing process in which silicon and polysilicon processes occur, such as deposition, doping and implanting processes, to create active devices such as transistors and other circuit elements. The back-end is the portion of the manufacturing process after the front-end, in which the metallization layers, contact hole layers and other connecting layers for the front-end devices are formed. For a typical foundry chip, there are about two silicon-type layers formed in a front-end, and about eight contact hole layers and eight metallization layers formed in a back-end: a total of 18 layers, for example. It is notable that 16 of these 18 layers are processed only for connecting purposes. Because traditional lithography can only form an image on a two-dimensional plane across a wafer surface, these 16 connection layers have to be processed one by one, requiring a different mask for each layer. By using a holographic reticle combined with a two-photon process as described herein, three-dimensional images can be reconstructed in a photoresist layer, thus patterning more than one layer in a single exposure.

Figure 24A:
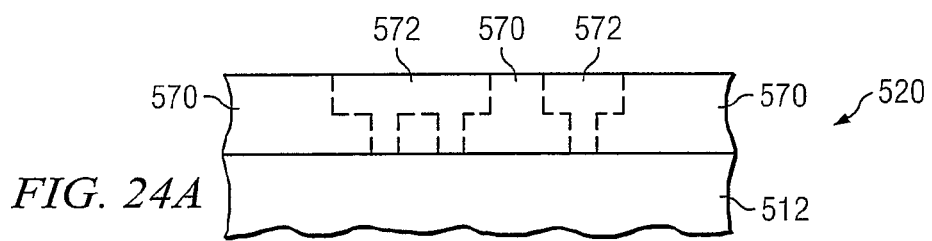
FIGS. 24A through 24D illustrate cross-sectional views of a workpiece at several stages of manufacturing, wherein three-dimensional patterns are formed in a photoresist, and the patterns are filled with a material to form 3-D structures in a material layer.
Figure 24B:
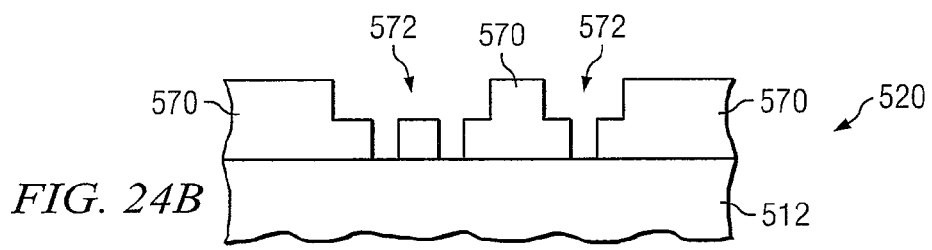
Figure 24C:
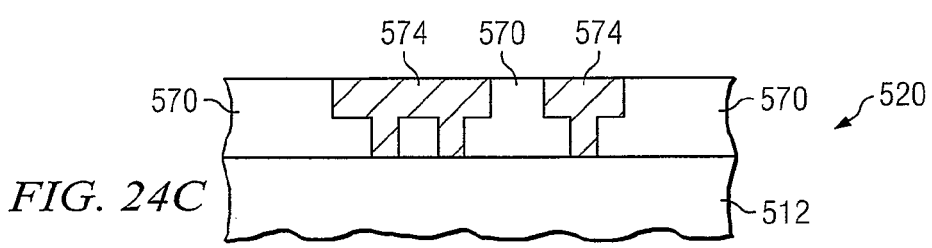
Figure 24D:
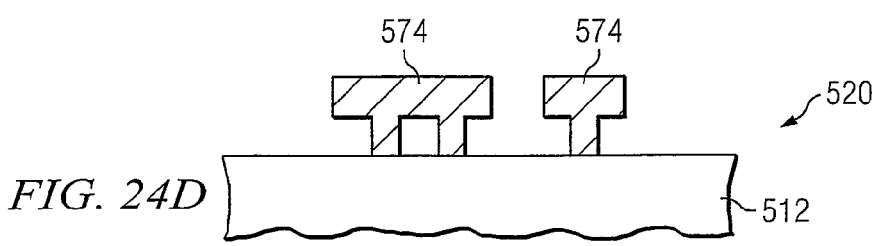

FIGS. 24A through 24D show cross-sectional views of a semiconductor device 520 in which a holographic reticle and two-photon process are used to pattern a 3D image of a semiconductor device 520, saving one level of lithography patterning. A workpiece 512 is provided, and a photoresist layer 570 is deposited over the workpiece 512. The photoresist 570 in this embodiment is preferably relatively thick, comprising a thickness of two or more material layers, for example. The photoresist 570 is patterned using a holographic reticle 440 such as the one shown in FIG. 23, and a two-photon process is used to illuminate the photoresist 570 through the holographic reticle 440, for example. The pattern 572 formed in the photoresist 570 in this embodiment comprises a dual damascene pattern, including a contact pattern (the thin regions) and conductive line pattern (the thicker regions disposed over the thin regions). Patterned portions of the photoresist 570 are removed, as shown in FIG. 24B, and a material 574 such as a conductive material (although other materials may also be used) is deposited over the patterned photoresist 570, as shown in FIG. 24C. Excess material 574 may be removed from over a top surface of the photoresist 570, using a chemical-mechanical polishing (CMP) process or other methods. The photoresist 570 is then removed, leaving a three-dimensional structure formed from the material 574, as shown in FIG. 24D. This is advantageous, because prior art damascene patterning methods for metal layers require two separate mask levels. Thus, embodiments of the present invention reduce the number of patterning steps and reduce the number of masks required for semiconductor fabrication.

Figure 25:
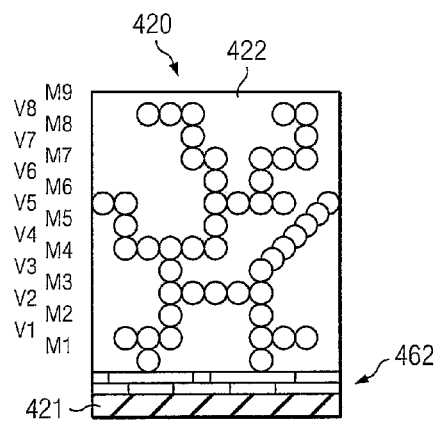
FIG. 25 illustrates a cross-sectional view of a semiconductor wafer in accordance with an embodiment of the invention, wherein multiple layers of interconnect are patterned within a single resist layer.
Figure 26:
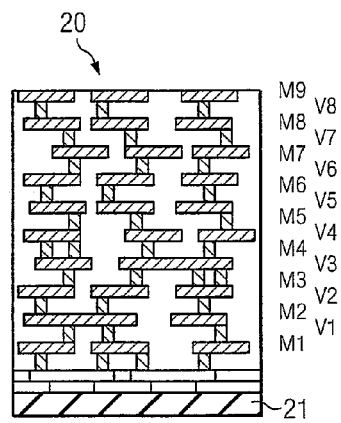
FIG. 26 show a prior art multi-layer device formed by a plurality of sequential deposition steps and patterning steps of photoresist and interconnect layers.

FIG. 25 illustrates an embodiment of the invention, wherein multiple layers of interconnect are patterned within a single resist layer disposed over a workpiece 421. Active areas 462 may be formed over the workpiece 421, as shown, for example. In this example, seventeen or more layers of metallization (M1-M9) and contact or via levels (V1-V8) may be replaced by a single holographic imaging process, combined with a two photon process. In comparison, FIG. 26 shows a prior art semiconductor device 20 having a multi-layer interconnect, formed by sequential depositions and patterning of photoresist and interconnect layers. Thus, in accordance with embodiments of the present invention, many sequential patterning steps and lithography masks may be eliminated, saving processing time and expense of designing and making the masks.

Figure 27:
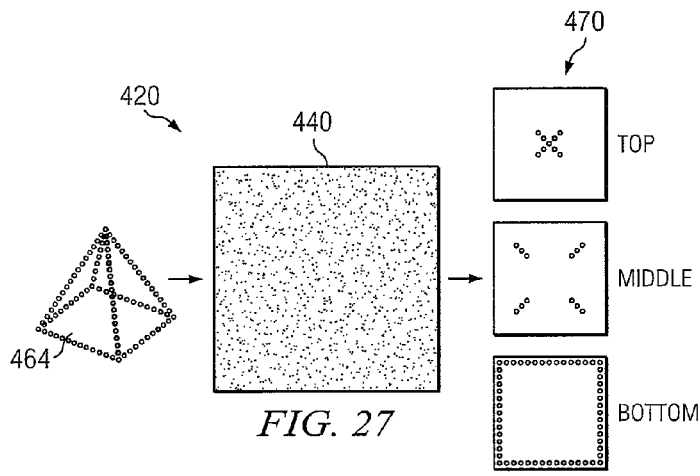
FIGS. 27 and 28 illustrate examples of 3-D pattern formation within a photoresist in accordance with an embodiment of the invention.
Figure 28:
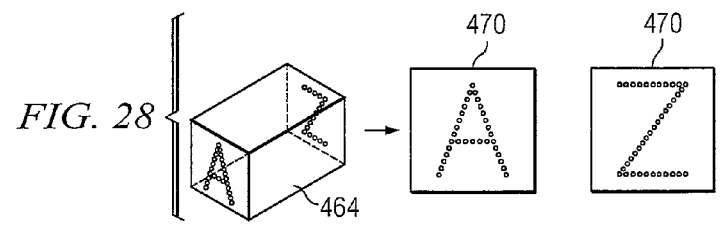

FIGS. 27 and 28 illustrate examples of 3-D pattern formation within a photoresist in accordance with an embodiment of the invention. In FIG. 27, a 3-D image 464 which may comprise a pyramid, for example, is converted into a holographic representation of the image, using an LET in one embodiment, although other methods may be used. The holographic representation is patterned onto a mask 440, and the mask 440 is used to pattern a single relatively thick layer of photoresist 470. Top, middle and bottom views of the photoresist 470 are shown. A material layer is deposited over the photoresist 470 to fill the 3-D pattern, and the photoresist is removed, leaving a 3-D structure formed over a workpiece (not shown in FIG. 27). Similarly, FIG. 28 illustrates a 3-D image 464 comprising the letters A and Z that are transferred to a holographic pattern (not shown), and the three-dimensional image of the letters is reconstructed using a hologram reticle and two-photon process into a photoresist layer 470 of a target, thus illustrating the capability of forming two layers of an image in one exposure, in accordance with embodiments of the present invention.

A short DOF and small focal point are required to induce exposed spots with the two photon process described herein. The hologram reticles 140/240/340/440 described herein produce a short DOF because of the characteristics of the holographic representation of the image. High order diffraction beams have a larger incident angle. The larger angle represents a higher numerical aperture (NA) and produce a shorter depth of focus (DOF). In accordance with embodiments of the present invention, a holographic pattern can be modified or designed so that it contains more or less higher order fringes in order to control the individual DOF.

FIGS. 29-36 illustrate yet another embodiment in which a 3-D pattern within the photoresist is utilized to form a Multi-Surface Imaging Composition (MUSIC). With a fixed DOF, a MUSIC may be utilized to enlarge the applicable process window because, as discussed further below, the DOF for a MUSIC is not required to extend completely through the photoresist. Additionally, a MUSIC works to also relieve the pressures related to a minimum pitch of a desired pattern and may be utilized to achieve a smaller pitch between developed photolithographic mask elements (more fully described below with respect to FIG. 35).

Figure 29:
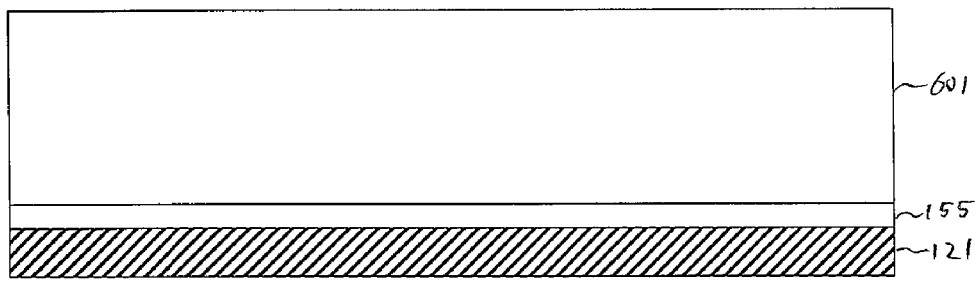
FIGS. 29-36 illustrate examples of a Multi-Surface Imaging Composition in accordance with an embodiment of the invention.

FIG. 29 illustrates a starting point of one embodiment to form a MUSIC, and illustrates the energy source 154, the hologram reticle 140, the workpiece 121, the material layer 155 and a layer of MUSIC photoresist 601 disposed over the material layer 155. In FIG. 29, the energy source 154, the hologram reticle 140, the workpiece 121 and the material layer 155 may be similar to the energy source 154, the hologram reticle 140, the workpiece 121 and the material layer 155 discussed above with respect to FIG. 15. However, as one of ordinary skill in the art will recognize, the energy source 154, the hologram reticle 140, the workpiece 121, and the material layer 155 may alternatively be different from those discussed above, so long as they are suitable to the currently described process.

The MUSIC photoresist 601 may be a photosensitive material that has a low optical density for wavelengths being used by the photolithographic process. For example, if a deep ultraviolet wavelength is being emitted from the energy source 154, a photosensitive material that is transparent to deep ultraviolet light may be utilized, although different materials may alternatively be used when different wavelengths of light are utilized. As an example only, if a deep ultraviolet wavelength is being utilized (with wavelengths between about 10 nm to about 400 nm, such as about 193 nm), the photosensitive material may include an alicyclic polymer such as the alternating copolymer of sulfur dioxide and 5-(2-t-butoxycarbonyloxy-2-trifluoromethyl1-3,3,3-trifluoropropyl)norbornene, also known as PFASO$_2$, whose structure is reproduced below.

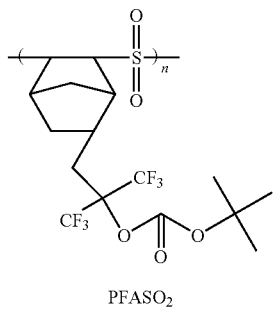

PFASO$_2$

The PFASO$_2$ may be formulated with a 4 wt-% TPS-Nf (wt photon acid generator/wt poly) along with 10 mol-% trioctylamine, and a complete procedure for preparing the PFASO$_2$ may be found in H. Ito, et al., Micro- and Nanopatterning Polymers, ACS Symposium Series Vol. 706 (1998), pp. 210-212 and A. Jamieson, et al., "TOP Surface Imaging at 157 nm," Proc. SPIE Vol. 4345 (2001), pp. 406-416, which references are fully incorporated herein by reference. Other suitably transparent photosensitive materials, such as 2-[4(-(1-ethoxymethoxy-2,2,2-trifluoro-1-trifluoromethyl-ethyl)cyclohexyl]-1,1,1,3,3,3-hexafluoropropan-2-ol (EOM-HF), 2-[4-(2,2,2-trifluoro-1-ethoxymethoxy-1-trifluoromethyl-ethyl)cyclohexane]hexafluoroisopropyl($\alpha$-trifluoromethyl)acrylate (FAF-EOM), 2-methyladamantyl($\alpha$-tifluoromethyl) acrylate (MAdFMA), Poly(2-[4-(2,2,2-trifluor-1-ethoxcymethoxy-1-trifluoromethylethyl)cyclohexane]hexafluoroisopropyl($\alpha$-trifluoromethyl)acrylate-co-2-methyladamantyl($\alpha$-trifluoromethyl)acrylate), p-t-Butoxytetrafluorostyrene (SFOBu), Poly($\alpha$-trifluoromethyl vinylacetate-co-StFA (Poly(CF$_3$VA-StFA)), Tetrahydropyranyl (THP) ether of (Poly(CF$_3$VA-StFA)), combinations of these, or the like, may alternatively be used.

The MUSIC photoresist 601 may be applied over the material layer 155 using any suitable placement technology, such as a spin-on process or a screening process. Additionally, when forming a MUSIC, the thickness of the MUSIC photoresist 601 may have a thickness that is greater than the minimum pitch between adjacent MUSIC photoresist elements (see e.g., P$_1$ between the first MUSIC photoresist element 603 and the second MUSIC photoresist element 605 in FIG. 30) in order to enhance the pitch relief of the MUSIC (described below with respect to FIG. 35). For example, for a desired element pitch of about 50 nm, the MUSIC photoresist 601 may have a thickness of greater than about 70 nm.

Once applied, the MUSIC photoresist 601 may be heated using a post-application baking procedure. In the post-application baking procedure the MUSIC photoresist 601 may be heated to a temperature of between about 60° C. and about 200° C., such as about 90° C. for a time of between about 30 seconds and about 600 seconds, such as about 60 seconds. Such a heating/baking helps to dehydrate the MUSIC photoresist 601 and helps to prepare it for exposure.

Figure 30:
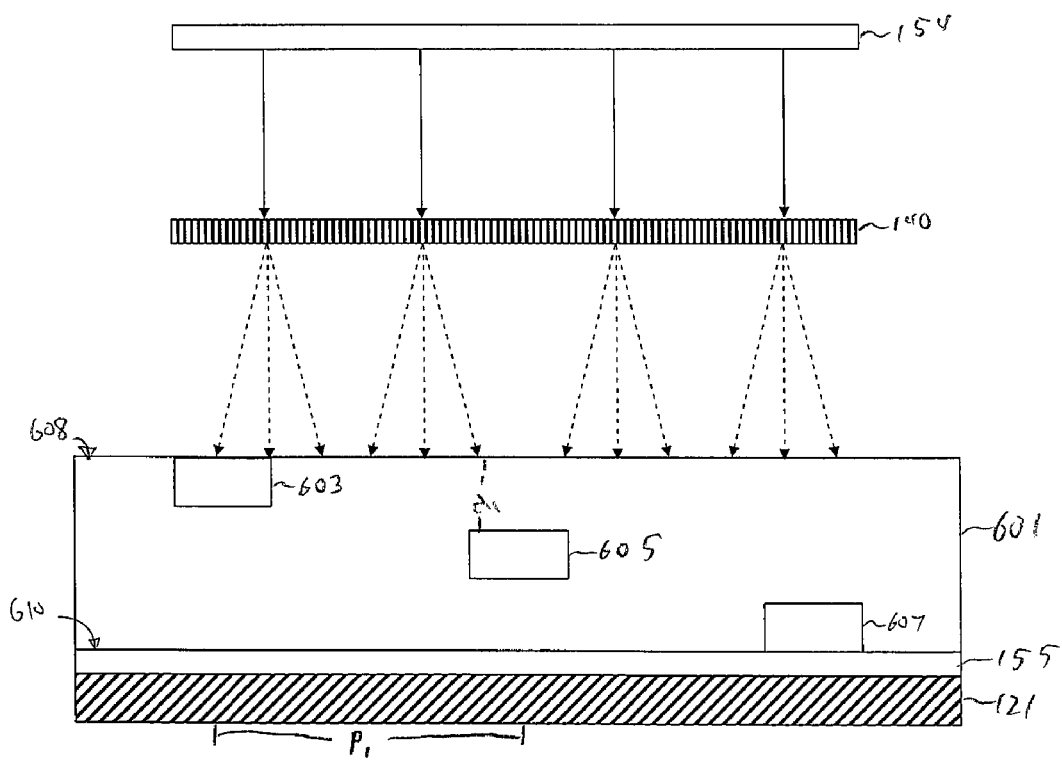

FIG. 30 illustrates that, once the MUSIC photoresist 601 has been applied to the material layer 155, the MUSIC photoresist 601 may be illuminated by the energy source 154 through the hologram reticle 140 as described above with respect to FIG. 15. This illumination as performed through the hologram reticle 140 may be used to form a 3-D pattern within the MUSIC photoresist 601 by generating different latent images or elements at different levels within the MUSIC photoresist 601 as described above with respect to FIGS. 24A-24D. Such a patterning allows for each of the different layers to eventually contribute to the final patterned image on the material layer 155.

For example, as shown in FIG. 30, the illumination with the energy source 154 and the hologram reticle 140 may form a first MUSIC photoresist element 603 along a top surface 608 of the MUSIC photoresist 601, a second MUSIC photoresist element 605 at a second layer of the MUSIC photoresist 601, and a third MUSIC photoresist element 607 at a third layer of the MUSIC photoresist 601 (for example along the bottom surface 610 of the MUSIC photoresist 601 adjacent to the material layer 155). By using a hologram reticle 140, a single holographic mask may be used along with a single exposure in order to pattern each of the elements in a "single mask/single exposure" process.

The first MUSIC photoresist element 603 may be formed along the top surface 608 of the MUSIC photoresist 601, and may be formed to have a thickness of between about 5 nm and about 40 nm, such as about 20 nm. The second MUSIC photoresist element 605 may be formed within the MUSIC photoresist 601, such as at a depth d$_1$ between about 5 nm and about 65 nm, such as about 30 nm, from the top surface 608 of the MUSIC photoresist 601, and may be formed to have a thickness of between about 5 nm and about 60 nm, such as about 40 nm. The third MUSIC photoresist element 607 may be formed along a bottom surface 610 of the MUSIC photoresist 601 and may have a thickness of between about 5 nm and about 60 nm, such as about 40 nm. Additionally, the MUSIC photoresist elements (e.g., the first MUSIC photoresist element 603 and the second MUSIC photoresist element 605) may have a pitch P$_1$ between about 20 nm and about 100 nm, such as about 50 nm.

Figure 31A:
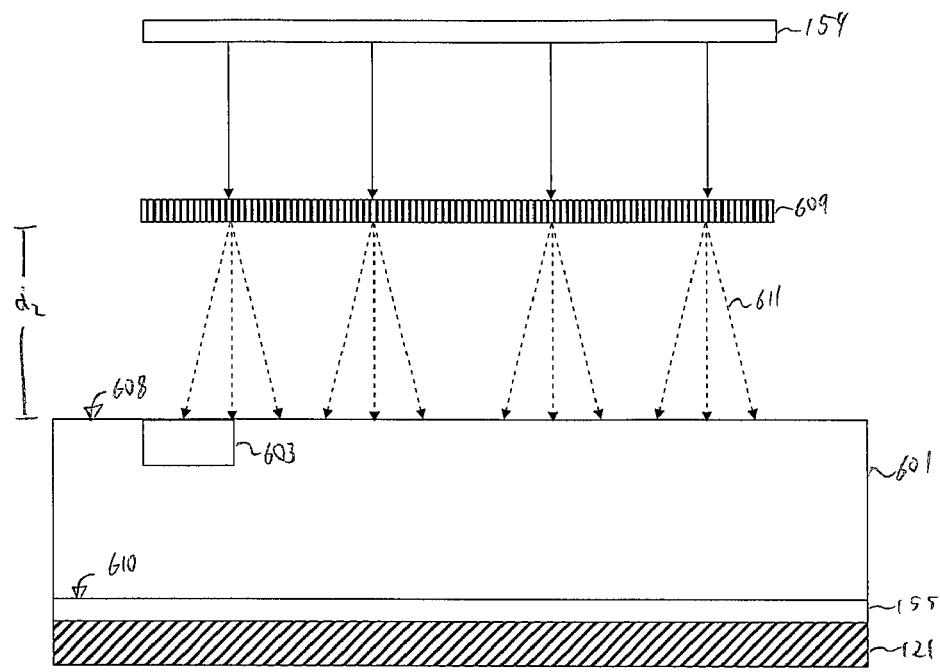
Figure 31B:
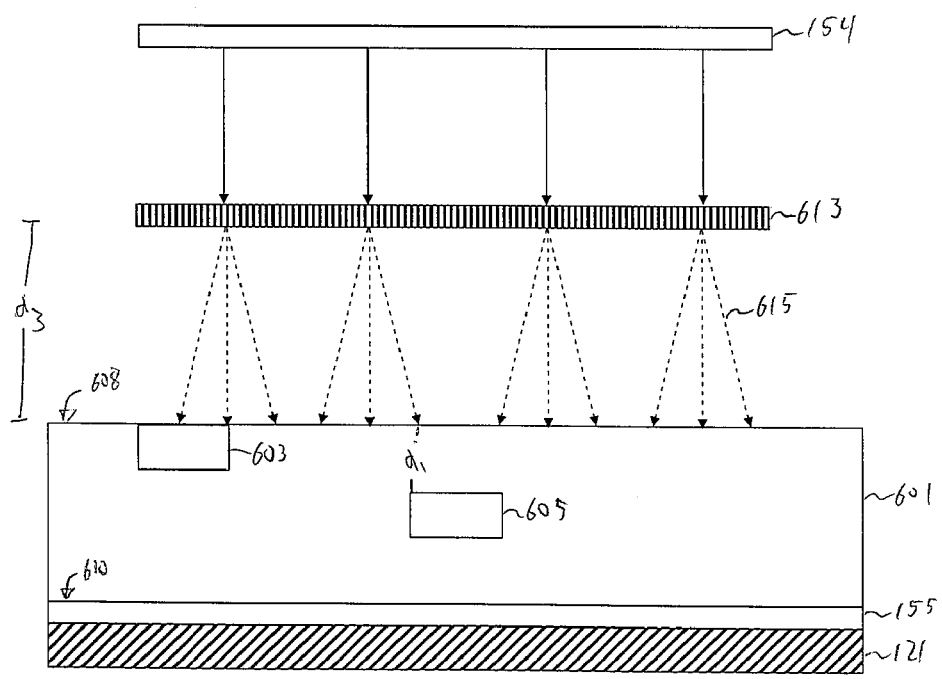
Figure 31C:
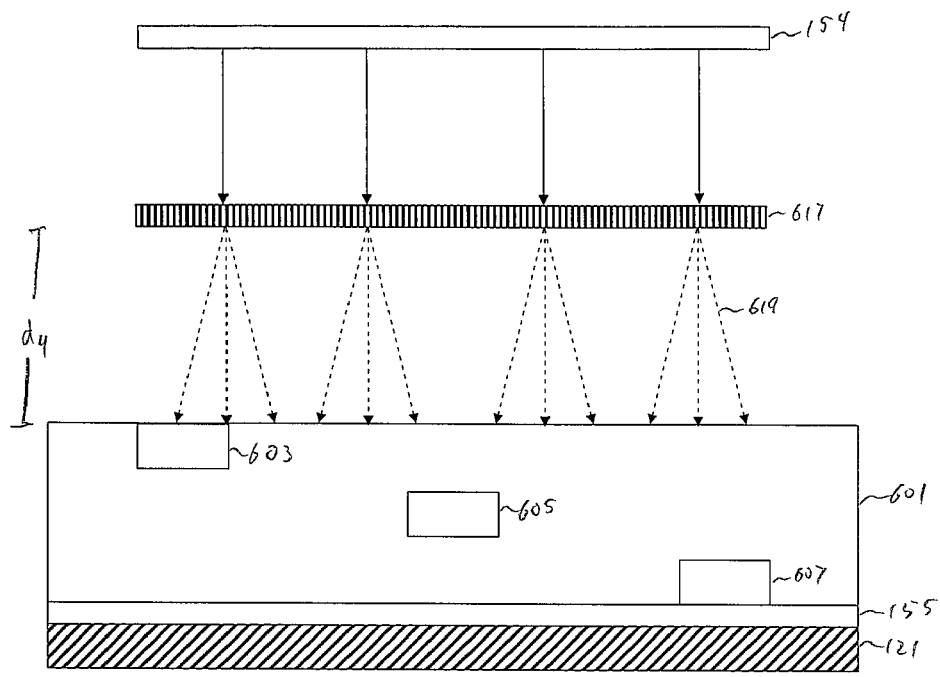

FIGS. 31A-31C illustrate an alternative method in which the first MUSIC photoresist element 603, second MUSIC photoresist element 605, and third MUSIC photoresist element 607 may be formed using a series of masks and exposures in a "multiple mask/multiple exposure" process. In this embodiment a first mask 609 is utilized in a first exposure (represented in FIG. 31A by arrows 611) to form the first MUSIC photoresist element 603. Within this first exposure, the distance d$_2$ between the top surface 608 of the MUSIC photoresist 601 and the first mask 609 is chosen such that the DOF illuminates a region adjacent the top surface 608 of the MUSIC photoresist 601, thereby also forming the first MUSIC photoresist element 603 adjacent the top surface 608 of the MUSIC photoresist 601. Additionally, by placing the DOF along the top surface 608 of the MUSIC photoresist 601, the first MUSIC photoresist element 603 may have a thickness equal to the DOF. Accordingly, if the system has a DOF of between about 20 nm and about 100 nm, such as about 40 nm, the first MUSIC photoresist element 603 will also have a thickness of between about 20 nm and about 100 nm, such as about 40 nm. Such a practice releases the MUSIC photoresist 601 from the traditional restriction that the thickness of the photoresist be less than the DOF so that the DOF extends through the entire thickness.

FIG. 31B illustrates the formation of the second MUSIC photoresist element 605 using a second mask 613 and a second exposure (represented in FIG. 31B by arrows 615). The depth at which the second MUSIC photoresist element 605 may be formed within the MUSIC photoresist 601 may be varied by adjusting the distance $d_3$ between the workpiece 121 and the second non-hologram mask 613 (which would replace the first non-hologram mask 611 in the same position). In this embodiment the distance $d_3$ may be such that the DOF illuminates the MUSIC photoresist 601 at a depth $d_1$ of between about 5 nm and about 50 nm from the top of the MUSIC photoresist 601, thereby also forming the second MUSIC photoresist element 605. The second MUSIC photoresist element 605, similar to the first MUSIC photoresist element 603, may be formed to have the same thickness as the DOF, or between about 5 nm and about 60 nm, such as about 40 nm.

FIG. 31C illustrates the formation of the third MUSIC photoresist element 607. In this embodiment a third mask 617 and third exposure (represented in FIG. 31C by arrows 619) are utilized to form the third MUSIC photoresist element 607. The third MUSIC photoresist element 607, similar to the second MUSIC photoresist element 605, may be formed at a third level within the MUSIC photoresist 601 by again varying the distance $d_4$ between the third non-hologram mask 617 (which replaces the second non-hologram mask 613) and the MUSIC photoresist 601 such that the DOF illuminates yet another depth of the MUSIC photoresist 601. In an embodiment, the third MUSIC photoresist element 607 may be formed adjacent to the material layer 155 and may be formed to have a thickness of the DOF, or between about 40 nm and about 60 nm, such as about 50 nm.

Alternatively, instead of having the first MUSIC photoresist element 603 and the third MUSIC photoresist element 607 have the same thickness as the DOF, the distance $d_1$ may be set such that only a portion of the DOF illuminates the MUSIC photoresist 601, with the remainder of the DOF falling outside of the MUSIC photoresist 601. For example, the DOF may fall partially within the MUSIC photoresist 601 with the remainder being either above the MUSIC photoresist 601 (in the case of the first MUSIC photoresist element 603) or below the MUSIC photoresist 601 (in the case of the third MUSIC photoresist element 607). These applications of the DOF are fully intended to be within the scope of the embodiments as long as the photoresist elements (e.g., the first MUSIC photoresist element 603 and the third MUSIC photoresist element 607) have a suitable thickness, such as greater than about 10% of the DOF.

Also, as one of ordinary skill in the art will recognize, the above described processes, in which one process is a "single mask/single exposure" process and another process is a "multiple mask/multiple exposure" process, are merely exemplary and are not intended to limit the present embodiments to these two processes. Any suitable combination of masks and exposures may also be included, such as multiple exposures using a single mask or reticle. All such combinations are fully intended to be included within the scope of the present embodiments.

Additionally, a two-photon process as described above with respect to FIGS. 24A-24D may be utilized to enhance the capabilities of either the "single mask/single exposure" or the "multiple mask/multiple exposure" processes. In this embodiment, instead of using a single, high energy photon (such as a UV photon) the molecules of the MUSIC photoresist 601 would absorb two low energy photons (such as IR photons). By using the two-photon process along with the "single mask/single exposure" or the "multiple mask/multiple exposure" processes, the DOF may be decreased, and the three-dimensional placement of the first MUSIC photoresist element 603, the second MUSIC photoresist element 605, and the third MUSIC photoresist element 607 may be more carefully controlled.

Once the first MUSIC photoresist element 603, the second MUSIC photoresist element 605, and the third MUSIC photoresist element 607 have been formed at their respective depths, a post exposure bake may be performed. The post exposure bake may be performed at the same temperatures and conditions as the post apply bake described above with respect to FIG. 29, although other suitable conditions may alternatively be utilized.

Figure 32A:
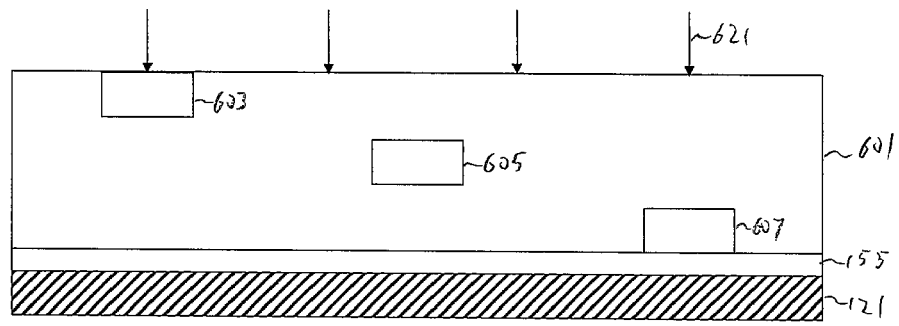

FIG. 32A illustrates that, once the first MUSIC photoresist element 603, the second MUSIC photoresist element 605, and the third MUSIC photoresist element 607 have been formed at varying depths within the MUSIC photoresist 601, a first development process (represented in FIG. 32A by arrows 621) may be used to develop the first MUSIC photoresist element 603 without developing the second MUSIC photoresist element 605 or the third MUSIC photoresist element 607 (as the second MUSIC photoresist element 605 and the third MUSIC photoresist element 607 remain unexposed). The first development process 621 may be utilized to chemically alter the first MUSIC photoresist element 603 so as to resist the subsequent removal of MUSIC photoresist 601 that was not illuminated. For example, a silylation process may be utilized by exposing the top layer of the MUSIC photoresist 601 to an atmosphere containing a silyation agent at a temperature of between about 70° C. and about 350° C. for about 1 to about 60 minutes. The silyation agent may be dimethylaminodimethyldisilane (DMADMDS), N,N Diethylaminotrimethylsilane (TMSDEA), 1,1,3,3-Tetramethyldisilazane (TMDS), Trimethylsilyldimethylamine (TMSDMA), Dimethylsilyldiethylamine (DMSDEA), Dimethylsilyldimethylamine (DMSDMA), combinations of these, or the like. However, as one of ordinary skill in the art will recognize, these are merely exemplary developers that may be utilized, and any other suitable alternative developer may be used to develop the first MUSIC photoresist element 603.

Figure 32B:
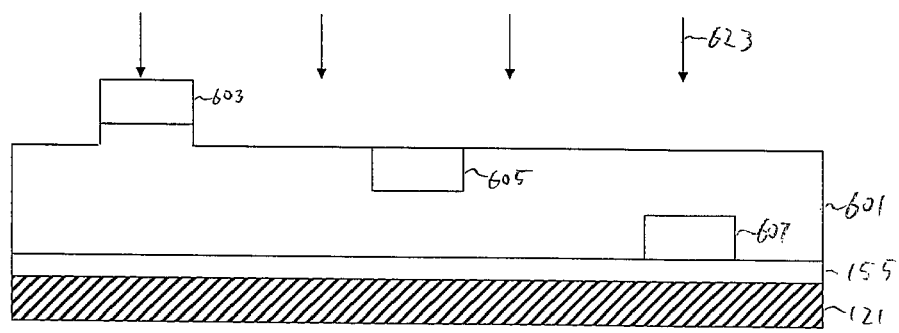

FIG. 32B illustrates that, once the first MUSIC photoresist element 603 has been developed, a first removal process (represented in FIG. 32B by arrows 623) may be utilized to remove the non-covered, non-developed MUSIC photoresist 601 that is not protected by the now-developed MUSIC photoresist element 603 and to expose the second MUSIC photoresist element 605. The removal process may be performed using a reactive ion etch (RIE), although any other suitable removal process may alternatively be used to remove the non-developed MUSIC photoresist 601 to expose the second MUSIC photoresist element 605.

Figure 33A:
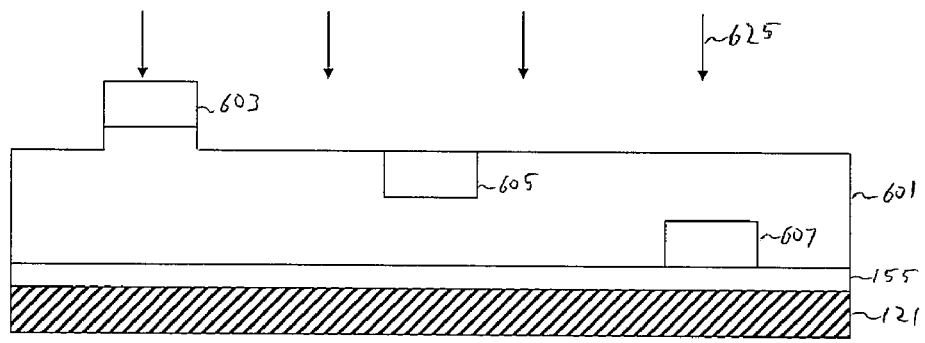

FIG. 33A illustrates that, once exposed, the second MUSIC photoresist element 605 may be developed using a second development process (represented in FIG. 33A by arrows 625). Similar to the development of the first MUSIC photoresist element 603, the second development process 625 may use a suitable developer, such as the silyation agents and processes described above with respect to FIG. 31A. However, as one of ordinary skill in the art will recognize, the development of the second MUSIC photoresist element 605 may occur using any suitable processes or developers, and are not necessarily the same processes or developers as used to develop the first MUSIC photoresist element 605.

Figure 33B:
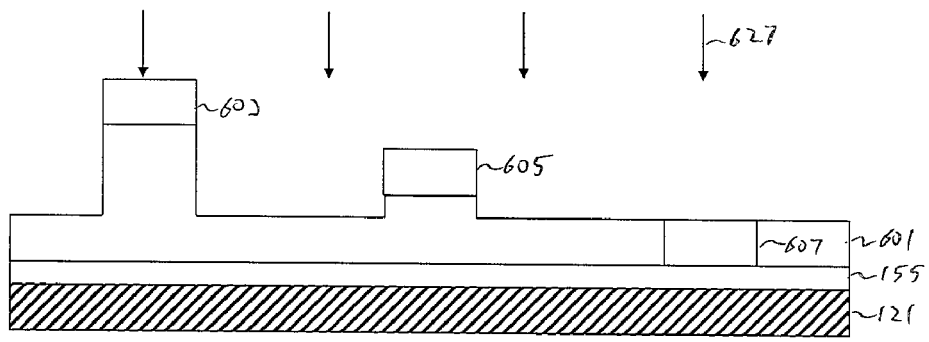

FIG. 33B illustrates that, once the second MUSIC photoresist element 605 has been developed, a suitable second removal process (represented in FIG. 33B by arrows 627), such as the RIE described above with respect to FIG. 32B, may used to remove portions of the MUSIC photoresist 601 and to expose the third MUSIC photoresist for development. However, because the first MUSIC photoresist element 603 and the second MUSIC photoresist element 605 overlie portions of the MUSIC photoresist 601, those portions of the MUSIC photoresist 601 underlying the first MUSIC photoresist element 603 and the second MUSIC photoresist element 605 are protected and are not removed along with the remainder of the MUSIC photoresist 601. As such, the images of the first MUSIC photoresist element 603 and the second MUSIC photoresist element 605 are transferred into the underlying MUSIC photoresist 601 as non-covered portions of the MUSIC photoresist 601 are removed.

Figure 34A:
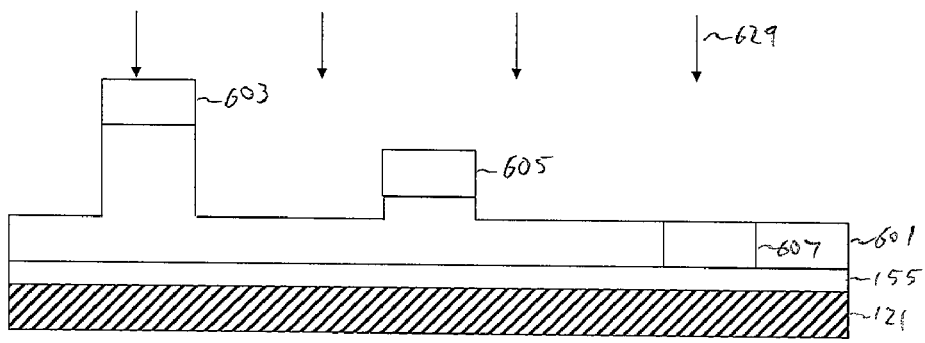

FIG. 34A illustrates that, once exposed, the third MUSIC photoresist element 607 may be developed using a third development process (represented in FIG. 34A by arrows 629). Similar to the development process described above with respect to FIG. 32A, the third MUSIC photoresist element 607 may be developed using a suitable developer, such as the silyation agents described above with respect to FIG. 31A. However, as one of ordinary skill in the art will recognize, other suitable developers may be utilized, and the present embodiment, while allowing for the first developer, second developer, and the third developer to be the same, does not require that they be the same, and different developers may be utilized for the different MUSIC photoresist elements.

Figure 34B:
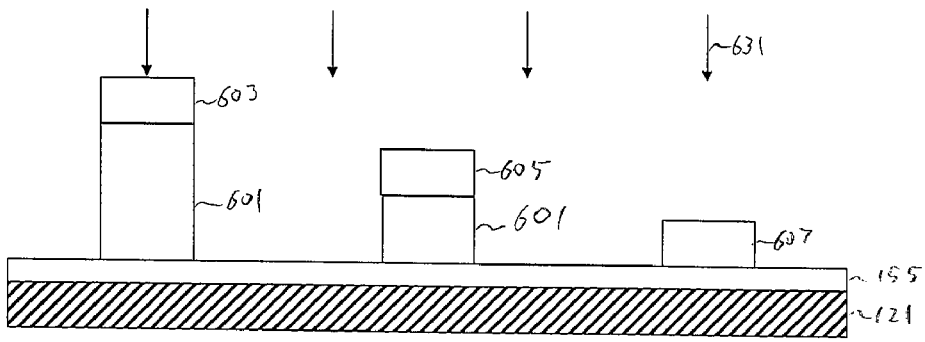

FIG. 34B illustrates that, once the third MUSIC photoresist element 607 has been developed, a suitable third removal process (represented in FIG. 34B by arrows 631), such as the RIE described above with respect to FIG. 32B may used to remove exposed portions of the MUSIC photoresist 601. However, because those portions of the MUSIC photoresist 601 located beneath the first MUSIC photoresist element 603, the second MUSIC photoresist element 605, and the third MUSIC photoresist element 607 are protected, those protected portions are not removed along with the remainder of the MUSIC photoresist 601. As such, the images of the first MUSIC photoresist element 603 and the second MUSIC photoresist element 605 are transferred into the underlying MUSIC photoresist 601 as non-covered portions of the MUSIC photoresist 601 are removed. The third removal process may continue until the material layer 155 has been exposed by the removal of the MUSIC photoresist 601.

Figure 35:
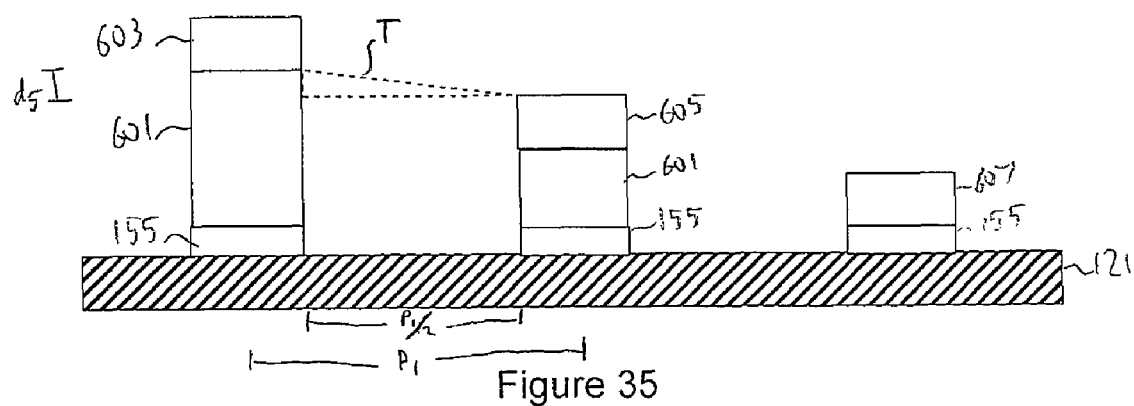

FIG. 35 illustrates that, once the material layer 155 has been exposed, portions of the material layer 155 may be removed except for those regions that remain protected by the first MUSIC photoresist element 603, the second MUSIC photoresist element 605, the third MUSIC photoresist element 607, and the underlying remnants of the MUSIC photoresist 601. The exposed material layer 155 may be removed using, e.g., an RIE process, although any other suitable removal technique may alternatively be utilized. Through this removal process, the latent image of each of the first MUSIC photoresist element 603, the second MUSIC photoresist element 605, and the third MUSIC photoresist element 607 are combined and transferred from the MUSIC photoresist elements to the underlying material layer 155, thereby allowing all of the images located in the different depths of the MUSIC photoresist 601 to contribute to the final pattern formed in the material layer 155.

FIG. 35 also illustrates the pitch relief that the MUSIC may allow by illustrating the triangle T between the first MUSIC photoresist element 603 and the second MUSIC photoresist element 605. Typically when a 1:1 pattern is used (wherein an image width is the same as a spacing between the images), if the MUSIC process were not used and the images were all formed to extend through the entire photoresist, the minimum spacing between latent images is expected to be approximately one-half of the pitch between the center of the images. However, because the MUSIC process separates the latent images into different depths within the MUSIC photoresist 601, the minimum space between the images is increased. The spacing between the images may be measured from the corners of the MUSIC photoresist elements (e.g., between the lower right corner of the first MUSIC photoresist element 603 and the upper left corner of the second MUSIC photoresist element 605). The minimum spacing between the first MUSIC photoresist element 603 and the second MUSIC photoresist element 605 for a 1:1 pattern may be approximated as:

$$\text{min.space}_{Triangle} = \sqrt{\left(\frac{P_1}{2}\right)^2 + (d_5)^2} \qquad \text{Eq. 1}$$

Where:
$P_1$=Pitch between elements from center to center; and
$d_5$=Height of the MUSIC photoresist from the bottom of the first MUSIC photoresist element 603 and the top of the second MUSIC photoresist element 605, wherein the height may be at least one-half of the difference between the minimum spacing and the pitch $P_1$.

Accordingly, by using the MUSIC process, the pitch and spacing between the MUSIC photoresist elements is relieved, allowing for smaller patterning to take place.

Figure 36:
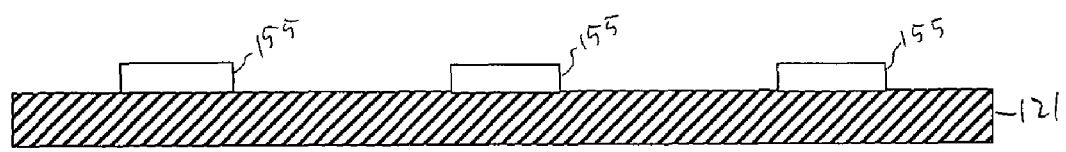

FIG. 36 illustrates the removal of the MUSIC photoresist 601, the first MUSIC photoresist element 603, the second MUSIC photoresist element 605, and the third MUSIC photoresist element 607 from the patterned material layer 155. The removal may be performed through a process such as wet resist stripping process, wherein the MUSIC photoresist 601, the first MUSIC photoresist element 603, the second MUSIC photoresist element 605, and the third MUSIC photoresist element 607 are all washed out.

Embodiments of the present invention are useful and have application in static holographic reticles, as described herein, wherein the holographic representation of the image is fixedly patterned into a reticle. However, embodiments of the present invention also have application in dynamic reticles, wherein the holographic fringe representation of the image may be altered or erased after being patterned into the reticle. Masks or reticles in which a dynamic holographic representation of an image may be patterned include electric-optical modulation devices such as a liquid crystal display (LCD), or micro-machined devices such as a special light modulator (SLM), as examples.

The holographic reticles described herein may comprise binary reticles, phase-shifted reticles, and/or volume reticles, for example. Fringes on a phase holographic reticle represent phase information rather than intensity information, for example. A volume holographic reticle comprises a holographic fringe representation of a 3-D structure, for example.

Embodiments of the present invention achieve technical advantages as a novel hologram reticle and lithography process that is defect-withstanding. Defects on the hologram reticle 140/240/340/440 are not transferred to the image produced on a target. Due to the characteristics of the holographic representation of the image, defects that are not too large in size or number may be left remaining on the hologram reticle 140/240/340/440, yet defect-free targets may be produced using the hologram reticle 140/240/340/440. This is advantageous because defect repair may be reduced or eliminated, resulting in a cost savings and increased yield for manufactured hologram reticles 140/240/340/440. If repair is needed, the hologram reticle 140/240/340/440 described herein is more durable for the repair process. Any defects on the hologram reticle 140/240/340/440 do not directly induce a flaw on a target, but rather, the defect influence is spread into the entire image, affecting intensity or contrast, or both, only slightly.

The multi-layer 3-D imaging technique using a holographic reticle described herein may be used with existing lithography tools, advantageously. No special design schemes or tools are required for the holographic reticle and patterning methods described herein.

Another advantage is that the hologram reticle 140/240/340/440 is CD error insensitive: critical dimension (CD) errors on holographic reticle will not affect the final image on the wafer or other target substantially. For a diffraction element, pitch is more important than the CD.

A further advantage is the ability to precisely control and decrease the DOF and form 3-D structures in the photoresist layer on the target using a two photon process. Combining the holographic reticle with a two photon process produces an extremely short DOF, allowing three-dimensional reconstruction in thick photoresist layers. Alternatively, the DOF may be increased to extend the lithography process window, which is particularly advantageous on a topographic substrate.

Furthermore, an LET can be used to reduce the calculation time required to convert the image to be patterned to a holographic representation on the hologram reticle 140/240/340/440. An LET can also be used to control the intensity of the individual image. A look-up table of fringes may be used to further reduce the time required for the conversion calculations.

Additional advantages include compatibility with existing exposure tools and lithography systems, and the ability to implement the hologram reticle 140/240/340/440 with TSI. Furthermore, the CGH algorithm used to convert the image to a holographic representation of the image may be modified to improve the image quality, including contrast, corner rounding, and depth of focus, as examples.

The defect-withstanding hologram reticle 140/240/340/440 described herein is particularly advantageous for use with X-ray Lithography (XRL), SCattering with Angular Limitation in Projection Electron beam Lithography (SCALPEL), Extreme Ultra-Violet Reflective Projection Lithography (EUVL), Ion-beam Projection Lithography (IPL), and E-beam Lithography processes, as examples Although embodiments of the present invention and their advantages have been described in detail, it should be understood that various changes, substitutions and alterations can be made herein without departing from the spirit and scope of the invention as defined by the appended claims For example, while the hologram reticle 140/240/340/440 is described herein as a transmissive reticle, (e.g. light is passed through the reticle towards the target), the hologram reticle 140/240/340/440 may alternatively comprise a reflective reticle. As another example, it will be readily understood by those skilled in the art that the selection of the target to be patterned using the hologram reticle described herein may be varied while remaining within the scope of the present invention. As examples, the target may comprise a semiconductor wafer, or may alternatively comprise an optical device, or an organic material, as examples. Embodiments of the present invention include targets such as semiconductor devices that have been patterned using the holographic reticles and methods of patterning described herein.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of patterning a material comprising:
providing a substrate comprising a material layer;
applying a photosensitive material over the material layer;
forming a first image within the photosensitive material, the first image being at a first depth from a top surface of the photosensitive material;
forming a second image within the photosensitive material, the second image being at a second depth different from the first depth;
developing the first image to form a developed first image;
removing photosensitive material located at the first depth without removing the developed first image;
developing the second image to form a developed second image;
removing photosensitive material located at the second depth without removing the developed second image; and
using the developed first image and the developed second image as a mask to pattern the material layer.

2. The method of claim 1, wherein a single exposure is used for both the forming a first image and the forming a second image.

3. The method of claim 2, wherein the single exposure is performed at least in part using a hologram reticle.

4. The method of claim 1, wherein the forming a first image is performed using a first mask and the forming a second image is performed using a second mask different from the first mask.

5. The method of claim 4, wherein a first distance between the first mask and the photosensitive material is different from a second distance between the second mask and the photosensitive material.

6. The method of claim 1, wherein the photosensitive material has a thickness that is at least as large as a pitch between the first image and the second image.

7. The method of claim 1, wherein the first image does not extend through the thickness of the photosensitive material.

8. The method of claim 1, wherein the developing the first image is performed at least in part through a silylation process.

9. A method of forming a mask, the method comprising:
providing a substrate;
applying a photosensitive material over the substrate;
forming an image within the photosensitive material, the image comprising a first element at a first depth from a top surface of the photosensitive material and a second element at a second depth different from the first depth;
developing the first element to form a first developed element and removing a first portion of undeveloped photosensitive material to expose the second element; and
developing the second element to form a second developed element and removing a second portion of undeveloped photosensitive material to expose the substrate.

10. The method of claim 9 wherein the forming an image further comprises:
illuminating the photosensitive material a first time to form the first element; and
illuminating the photosensitive material a second time to form the second element.

11. The method of claim 10, further comprising:
placing the substrate beneath a first mask to illuminate the photosensitive material a first time, the mask being located at a first distance away from the substrate; and
placing the substrate beneath a second mask to illuminate the photosensitive material a second time, the second mask located a second distance away from the substrate, the second distance being different from the first distance.

12. The method of claim 9, wherein the forming an image is performed using a single illumination.

13. The method of claim 12, wherein the using a single exposure is performed at least in part using a hologram reticle.

14. The method of claim 9, wherein the developing the first element is performed at least in part through a silyation process.

15. The method of claim 9, wherein the forming an image is performed at least in part using a two-photon process.

16. A method of patterning, the method comprising:
providing a substrate;
applying a photosensitive material to the substrate;
placing the substrate into an imaging device, the imaging device comprising a reticle;
forming a multi-surface imaging composition in the photosensitive material by exposing the photosensitive material to an energy that is filtered by the reticle, the multi-surface imaging composition comprising a first image at a first depth within the photosensitive material and a second image at a second depth different from the first depth within the photosensitive material, the second image being laterally removed from the first image;
performing a first silyation on the first image while the second image remains protected from the first silyation;
removing a first portion of photosensitive material to expose the second image;
performing a second silyation on the second image; and
removing a second portion of photosensitive material to expose the sidewalls of the second image after the performing a second silyation.

17. The method of claim 16, wherein exposing the photosensitive material comprises one or more exposures with a single reticle.

18. The method of claim 16, wherein the exposing the photosensitive material comprises a plurality of exposures, each of the plurality of exposures using a different reticle.

19. The method of claim 18, wherein each reticle is located a different distance from the photosensitive material.

20. The method of claim 16, wherein the photosensitive material has a first thickness and a depth of focus of the reticle has a second thickness less than the first thickness.

* * * * *